United States Patent
Ohashi et al.

(10) Patent No.: US 7,833,567 B2
(45) Date of Patent: Nov. 16, 2010

(54) METHOD FOR FORMING ELECTRICAL CIRCUIT BY JETTING MOLTEN METAL

(75) Inventors: Hitoshi Ohashi, Shizuoka (JP); Kinya Horibe, Shizuoka (JP); Hitoshi Ushijima, Shizuoka (JP); Tatsuya Kato, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 825 days.

(21) Appl. No.: 10/047,992

(22) Filed: Jan. 17, 2002

(65) Prior Publication Data

US 2002/0105358 A1 Aug. 8, 2002

(30) Foreign Application Priority Data

Jan. 19, 2001 (JP) ............................. 2001-011896
Jan. 11, 2002 (JP) ............................. 2002-003995

(51) Int. Cl.
*B05D 5/12* (2006.01)
*C23C 16/52* (2006.01)

(52) U.S. Cl. ......................... 427/8; 427/96.1; 427/98.4; 427/427.3

(58) Field of Classification Search ..................... 427/8, 427/455, 96.1, 98.4, 427.3
See application file for complete search history.

(56) References Cited

U.S. PATENT DOCUMENTS 4,196,437 A * 4/1980 Hertz ........................... 347/98
4,656,048 A * 4/1987 Kudoh et al. .................... 427/8

(Continued)

FOREIGN PATENT DOCUMENTS

DE 39 13 028 A1 10/1990

(Continued)

OTHER PUBLICATIONS

European Search Report dated Jun. 1, 2005 (4 pages).

(Continued)

*Primary Examiner*—Brian K Talbot
(74) *Attorney, Agent, or Firm*—Kratz, Quintos & Hanson, LLP

(57) ABSTRACT

The apparatus forms an electric circuit on a construction member of a machine based on a set of three-dimensional data. The data defines a position and a profile of the construction member, a position of the electric circuit, and a shape of the electric circuit. The electric circuit is used for electrical connection between electric instruments mounted on the machine. The data is associated with a reference coordinate system provided in the machine, and the data includes coordinates of points for determining arrangement of the electric circuit, a distance between any two of the points adjacent to each other, and a cross-sectional area of the electric circuit associated extended between the two points. The apparatus has a storage means for storing the data, a jet means for jetting a molten metal, a first transfer means for moving the construction member relative to the jet means, and a control means for jetting the molten metal against the construction member to deposit the molten metal and for controlling the relative movement between the construction member and the jet means based on the data. The jet means can jet the molten metal against the construction member so that the molten metal can be deposited on a surface of the construction member to form the electric circuit on the construction member.

14 Claims, 15 Drawing Sheets

U.S. PATENT DOCUMENTS

| | | | | |
|---|---|---|---|---|
| 5,340,090 A | * | 8/1994 | Orme et al. | 266/202 |
| 5,746,844 A | * | 5/1998 | Sterett et al. | 148/522 |
| 6,309,711 B1 | * | 10/2001 | Tseng et al. | 427/474 |
| 6,501,663 B1 | * | 12/2002 | Pan | 361/779 |
| 6,503,831 B2 | * | 1/2003 | Speakman | 438/674 |
| 6,520,402 B2 | * | 2/2003 | Orme-Marmerelis et al. | 228/260 |
| 6,877,853 B2 | * | 4/2005 | Kiguchi et al. | 347/102 |

FOREIGN PATENT DOCUMENTS

| | | | |
|---|---|---|---|
| DE | 195 02 044 A1 | | 7/1996 |
| GB | 2 330 331 A | | 4/1999 |
| JP | 62-108595 | * | 5/1987 |
| JP | 07-231154 | * | 8/1995 |
| JP | 10-226803 | * | 8/1998 |
| JP | 11-040937 | * | 2/1999 |
| WO | WO 89/05567 | | 6/1989 |

OTHER PUBLICATIONS

Patent Abstracts of Japan, vol. 1999, No. 14, Dec. 22, 1999 & JP 11 261193 A (Sintokogio Ltd.), Sep. 24, 1999.

Patent Abstracts of Japan, vol. 1997, No. 5, May 30, 1997 & JP 09 018116 A (Graphtec Corp.), Jan. 17, 1997.

* cited by examiner

METHOD FOR FORMING ELECTRICAL CIRCUIT BY JETTING MOLTEN METAL

BACKGROUND OF THE INVENTION

1. Field of the Invention

The present invention relates to a method and an apparatus for forming an electric circuit disposed on a construction member of a machine like a car. A forty-fifth aspect of the invention is the apparatus as described in the thirty-seventh aspect

2. Related Art

Referring to FIG. 19, a car 121 has electric appliances including lamps such as head lamps and tail lamps, motors like a starter motor and an air-conditioning motor, etc.

As illustrated in FIG. 20, the car 121 has a door 113 mounted with a speaker 115, a power window switch unit 116, a door lock unit 117, and a power window motor (not shown). The door 113 further has a door panel 114 made from a metal sheet and a door trim panel 112 arranged inside the door panel 114. The door panel 114 and the door trim panel 112 are construction members of the car 121.

On one of the door panel 114 and the door trim panel 112, there are disposed the speaker 115, the power window switch unit 116, the door lock unit 117, and the power window motor. The speaker 115 receives sound signals for a car stereo player to provide audio sounds to occupants in the car 121.

The power window switch unit 116, which is operated by an occupant, moves upward and downward a door glass. The power window switch unit 116 also makes the door lock unit 117 lock and unlock the door 113. The power window motor, which is operated by the power window switch unit 116, moves the door glass of the door 3.

The door 113 of the car 121 is arranged with a wiring harness 100 (see FIG. 20) for providing an electrical power and control signals to the speaker 115, the power window switch unit 116, the door lock unit 117, and the power window motor. The wiring harness 100 has a plurality of electrical cables composing electric circuits, connectors 101, 102, 103, 104, and 105 fitted to the cables at desired positions, protectors 106, and clips 107. Each of the cables is a covered cable having conductor core wires and a covering insulating layer for covering the core wires.

The plurality of cables are tied in a bundle with tapes in a desired pattern and fitted with the protectors 106 and the clips 107 at predetermined positions to compose the wiring harness 100. The clips 107 secure the wiring harness 100 on the door panel 114 or the door trim panel 112 between the door panel 114 and the door trim panel 112.

The connectors 101, 102, 103, 104, and 105 each are coupled to an associated connector of a main wiring harness or each electric instrument 115, 116, or 117 which is mounted on a body 118 of the car 121.

The electrical connection of connectors 101, 102, 103, 104, and 105 with the associated connectors of the main wiring harness and the electric instruments 115, 116, and 117 enables to provide an electrical power and control signals to each of the electric instruments 115, 116, and 117. Thus configured wiring harness 100 is fitted on the door 113 to move upward and downward the door glass and to lock and unlock the door.

At a design step of the car 121, positions and sizes of construction members and parts are determined in the use of a three-dimensional coordinate system C having axes X, Y, and Z as illustrated in FIG. 19. The coordinate system can show any position of the whole body of the car 121. An origin of the coordinate system may be positioned at a desired position in the car 121.

A set of three-dimensional data D1 based on the coordinate system determines positions and sizes of construction members and parts of the car 121. The data D1 includes coordinates to position each electrical cable constituting the wiring harness 100, a length of the cable, and a cross-sectional area of the cable.

To fabricate the wiring harness 100 based on the three-dimensional data D1, first, a two-dimensional developed plan of each cable is provided. Next, electrical cables are cut each to have a desired length, and the cables constituting the wiring harness 100 are arranged on a wiring board 110 shown in FIG. 21. These electrical cables are tied in a bundle with winding tapes to provide a predetermined pattern, and the bundle of cables is provided with other fittings such as the protector 106 and the clip 107 to assemble the wiring harness 100.

The wiring board 110 is a plate having a flat surface. On the surface of the wiring board 110, there is drawn an arrangement pattern of the electrical cables including positions of the connectors 101 to 105 and other fittings such as the protector 106 and the clip 107. The wiring board 110 is provided with a plurality of locating pins 111 for positioning the electrical cables according to the arrangement pattern.

As described above, in the conventional forming method of the wiring harness 100, a two-dimensional drawing of each electrical cable of the wiring harness 100 based on the aforementioned data D1 is provided after a general design of the car 121. Then, electrical cables each having a desired length are arranged on the wiring board 110 to assemble the wiring harness 100.

The conventional forming method of the wiring harness 100 requires a large amount of man hours for preparing the two-dimensional drawings and cutting electrical cables each to have a desired length before the assembling of the wiring harness 100. Furthermore, test wiring harnesses for a new model of cars require a considerable amount of time and cost.

SUMMARY OF THE INVENTION

Therefore, an object of the invention is to provide a method and an apparatus for forming an electric circuit which allows a reduced time or man hour for developing the electric circuit from a design for a mass production thereof.

For achieving the object, a first aspect of the invention is a method for forming an electric circuit on a construction member of a machine based on a set of three-dimensional data, the data used to determine a position and a profile of the construction member, a position of the electric circuit, and a shape of the electric circuit, the electric circuit used for electrical connection between electric instruments mounted on the construction member, wherein the data is associated with a reference coordinate system provided in the machine, and the data includes coordinates of points for determining arrangement of the electric circuit, a distance between any two of the points adjacent to each other, and a cross-sectional area of the electric circuit extended between the two points, the method comprising the step of jetting a molten metal against the construction member to deposit the molten metal on a surface of the construction member to form the electric circuit on the construction member based on the data.

A second aspect of the invention is a method for forming an electric circuit on a construction member of a machine based on a set of three-dimensional data, the data used to determine a position and a profile of the construction member, a position of the electric circuit, and a shape of the electric circuit, the electric circuit used for electrical connection between electric instruments mounted on the construction member, wherein the data is associated with a reference coordinate system provided in the machine, and the data includes coordinates of points for determining arrangement of the electric circuit, a distance between any two of the points adjacent to each other, and a cross-sectional area of the electric circuit extended between the two points, the method comprising the step of jetting a molten electrically conductive plastic against the construction member to deposit the electrically conductive plastic on a surface of the construction member to form the electric circuit on the construction member based on the data.

A third aspect of the invention is a method for forming an electric circuit on a construction member of a machine based on a set of three-dimensional data, the data used to determine a position and a profile of the construction member, a position of the electric circuit, and a shape of the electric circuit, the electric circuit used for electrical connection between electric instruments mounted on the construction member, wherein the data is associated with a reference coordinate system provided in the machine, and the data includes coordinates of points for determining arrangement of the electric circuit, a distance between any two of the points adjacent to each other, and a cross-sectional area of the electric circuit extended between the two points, the method comprising the step of jetting an electrically conductive paste which includes a metal, a resin, and a solution for dissolving the resin against the construction member to deposit the electrically conductive plastic on a surface of the construction member to form the electric circuit on the construction member based on the data.

A fourth aspect of the invention is a method for forming an electric circuit on a construction member of a machine based on a set of three-dimensional data, the data used to determine a position and a profile of the construction member, a position of the electric circuit, and a shape of the electric circuit, the electric circuit used for electrical connection between electric instruments mounted on the construction member, wherein the data is associated with a reference coordinate system provided in the machine, and the data includes coordinates of points for determining arrangement of the electric circuit, a distance between any two of the points adjacent to each other, and a cross-sectional area of the electric circuit extended between the two points, the method comprising the step of converting the data to a second set of data associated with a reference coordinate system provided in the construction member, the method further comprising the step of jetting a molten metal against the construction member to deposit the molten metal on a surface of the construction member to form the electric circuit on the construction member based on the second set of data.

A fifth aspect of the invention is a method for forming an electric circuit on a construction member of a machine based on a set of three-dimensional data, the data used to determine a position and a profile of the construction member, a position of the electric circuit, and a shape of the electric circuit, the electric circuit used for electrical connection between electric instruments mounted on the construction member, wherein the data is associated with a reference coordinate system provided in the machine, and the data includes coordinates of points for determining arrangement of the electric circuit, a distance between any two of the points adjacent to each other, and a cross-sectional area of the electric circuit extended between the two points, the method comprising the step of converting the data to a second set of data associated with a reference coordinate system provided in the construction member, the method further comprising the step of jetting a molten electrically conductive plastic against the construction member to deposit the electrically conductive plastic on a surface of the construction member to form the electric circuit on the construction member based on the second set of data.

A sixth aspect of the invention is a method for forming an electric circuit on a construction member of a machine based on a set of three-dimensional data, the data used to determine a position and a profile of the construction member, a position of the electric circuit, and a shape of the electric circuit, the electric circuit used for electrical connection between electric instruments mounted on the construction member, wherein the data is associated with a reference coordinate system provided in the machine, and the data includes coordinates of points for determining arrangement of the electric circuit, a distance between any two of the points adjacent to each other, and a cross-sectional area of the electric circuit extended between the two points, the method comprising the step of converting the data to a second set of data associated with a reference coordinate system provided in the construction member, the method comprising the step of jetting an electrically conductive paste which includes a metal, a resin, and a solution for dissolving the resin against the construction member to deposit the electrically conductive plastic on a surface of the construction member to form the electric circuit on the construction member based on the second set of data.

A seventh aspect of the invention is the method as described in the first aspect wherein an insulator is layered on the electric circuit.

An eighth aspect of the invention is the method as described in the seventh aspect wherein the method comprises the step of jetting a molten metal against the construction member to deposit the molten metal on the insulator.

A ninth aspect of the invention is the method as described in the seventh aspect wherein the method comprises the step of jetting a molten electrically conductive plastic against the construction member to deposit the electrically conductive plastic on the insulator.

A tenth aspect of the invention is the method as described in the seventh aspect wherein the method comprises the step of jetting an electrically conductive paste which includes a metal, a resin, and a solution for dissolving the resin, against the construction member to deposit the electrically conductive paste on the insulator.

An eleventh aspect of the invention is a method for forming an electric circuit on an insulating intermediate member laid on a construction member of a machine based on a set of three-dimensional data, the data used to determine a position and a profile of the construction member, a position of the electric circuit, and a shape of the electric circuit, the electric circuit used for electrical connection between electric instruments mounted on the construction member, wherein the data is associated with a reference coordinate system provided in the machine, and the data includes coordinates of points for determining arrangement of the electric circuit, a distance between any two of the points adjacent to each other, and a cross-sectional area of the electric circuit extended between the two points, the method comprising the step of jetting a molten metal against the construction member to deposit the molten metal on a surface of the insulating intermediate member to form the electric circuit on the insulating intermediate member based on the data.

A twelfth aspect of the invention is a method for forming an electric circuit on an insulating intermediate member laid on a construction member of a machine based on a set of three-dimensional data, the data used to determine a position and a profile of the construction member, a position of the electric circuit, and a shape of the electric circuit, the electric circuit used for electrical connection between electric instruments mounted on the construction member, wherein the data is associated with a reference coordinate system provided in the machine, and the data includes coordinates of points for determining arrangement of the electric circuit, a distance between any two of the points adjacent to each other, and a cross-sectional area of the electric circuit extended between the two points, the method comprising the step of jetting a molten electrically conductive plastic against the insulating intermediate member to deposit the electrically conductive plastic on a surface of the insulating intermediate member to form the electric circuit on the surface of the insulating intermediate member based on the data.

A thirteenth aspect of the invention is a method for forming an electric circuit on an insulating intermediate member laid on a construction member of a machine based on a set of three-dimensional data, the data used to determine a position and a profile of the construction member, a position of the electric circuit, and a shape of the electric circuit, the electric circuit used for electrical connection between electric instruments mounted on the construction member, wherein the data is associated with a reference coordinate system provided in the machine, and the data includes coordinates of points for determining arrangement of the electric circuit, a distance between any two of the points adjacent to each other, and a cross-sectional area of the electric circuit extended between the two points, the method comprising the step of jetting an electrically conductive paste which includes a metal, a resin, and a solution for dissolving the resin, against the insulating intermediate member to deposit the electrically conductive paste on a surface of the insulating intermediate member to form the electric circuit on the surface of the insulating intermediate member based on the data.

A fourteenth aspect of the invention is a method for forming an electric circuit on an insulating intermediate member laid on a construction member of a machine based on a set of three-dimensional data, the data used to determine a position and a profile of the construction member, a position of the electric circuit, and a shape of the electric circuit, the electric circuit used for electrical connection between electric instruments mounted on the construction member, wherein the data is associated with a reference coordinate system provided in the machine, and the data includes coordinates of points for determining arrangement of the electric circuit, a distance between any two of the points adjacent to each other, and a cross-sectional area of the electric circuit extended between the two points, the method comprising the step of converting the data to a second set of data associated with a reference coordinate system provided in the construction member or on the intermediate member, the method comprising the step of jetting a molten metal against the insulating intermediate member to deposit the molten metal on a surface of the insulating intermediate member to form the electric circuit on the surface of the insulating intermediate member based on the second set of data.

A fifteenth aspect of the invention is a method for forming an electric circuit on an insulating intermediate member laid on a construction member of a machine based on a set of three-dimensional data, the data used to determine a position and a profile of the construction member, a position of the electric circuit, and a shape of the electric circuit, the electric circuit used for electrical connection between electric instruments mounted on the construction member, wherein the data is associated with a reference coordinate system provided in the machine, and the data includes coordinates of points for determining arrangement of the electric circuit, a distance between any two of the points adjacent to each other, and a cross-sectional area of the electric circuit extended between the two points, the method comprising the step of converting the data to a second set of data associated with a reference coordinate system provided in the construction member or on the intermediate member, the method comprising the step of jetting to a molten electrically conductive plastic against the insulating intermediate member to deposit the molten metal on a surface of the insulating intermediate member to form the electric circuit on the surface of the insulating intermediate member based on the second set of data.

A sixteenth aspect of the invention is a method for forming an electric circuit on an insulating intermediate member laid on a construction member of a machine based on a set of three-dimensional data, the data used to determine a position and a profile of the construction member, a position of the electric circuit, and a shape of the electric circuit, the electric circuit used for electrical connection between electric instruments mounted on the construction member, wherein the data is associated with a reference coordinate system provided in the machine, and the data includes coordinates of points for determining arrangement of the electric circuit, a distance between any two of the points adjacent to each other, and a cross-sectional area of the electric circuit extended between the two points, the method comprising the step of converting the data to a second set of data associated with a reference coordinate system provided in the construction member or on the intermediate member, the method comprising the step of jetting an electrically conductive paste which includes a metal, a resin, and a solution for dissolving the resin, against the insulating intermediate member to deposit the molten metal on a surface of the insulating intermediate member to form the electric circuit on the surface of the insulating intermediate member based on the second set of data.

A seventeenth aspect of the invention is the method as described in the eleventh aspect wherein an insulator is layered on the electric circuit defined on the insulating intermediate member.

An eighteenth aspect of the invention is the method as described in the seventeenth aspect wherein the method comprises the step of jetting a molten metal against the insulator to deposit the molten metal on the insulator.

A nineteenth aspect of the invention is the method as described in the seventeenth aspect wherein the method comprises the step of jetting a molten electrically conductive plastic against the insulator to deposit the electrically conductive plastic on the insulator.

A twelfth aspect of the invention is the method as described in the seventeenth aspect wherein the method comprises the step of jetting an electrically conductive paste which includes a metal, a resin, and a solution for dissolving the resin, against the insulator to deposit the electrically conductive plastic on the insulator.

A twenty-first aspect of the invention is an apparatus for forming an electric circuit on a construction member of a machine based on a set of three-dimensional data, the data used to determine a position and a profile of the construction member, a position of the electric circuit, and a shape of the electric circuit, the electric circuit used for electrical connection between electric instruments mounted on the machine, wherein the data is associated with a reference coordinate system provided in the machine, and the data includes coordinates of points for determining arrangement of the electric circuit, a distance between any two of the points adjacent to each other, and a cross-sectional area of the electric circuit associated with each of the distances, the apparatus comprising a storage means for storing the data, a jet means for jetting a molten metal, a first transfer means for moving the construction member relative to the jet means, and a control means for controlling the jet means and for controlling the relative movement between the construction member and the jet means based on the data, whereby the jet means can jet the molten metal against the construction member so that the molten metal can be deposited on a surface of the construction member to form the electric circuit on the construction member.

A twenty-two aspect of the invention is an apparatus for forming an electric circuit on a construction member of a machine based on a set of three-dimensional data, the data used to determine a position and a profile of the construction member, a position of the electric circuit, and a shape of the electric circuit, the electric circuit used for electrical connection between electric instruments mounted on the machine, wherein the data is associated with a reference coordinate system provided in the machine, and the data includes coordinates of points for determining arrangement of the electric circuit, a distance between any two of the points adjacent to each other, and a cross-sectional area of the electric circuit associated with each of the distances, the apparatus comprising a storage means for storing the data, a jet means for jetting a molten electrically conductive plastic, a first transfer means for moving the construction member relative to the jet means, and a control means for controlling the jet means and for controlling the relative movement between the construction member and the jet means based on the data, whereby the jet means can jet the molten metal against the construction member so that the molten electrically conductive plastic can be deposited on a surface of the construction member to form the electric circuit on the construction member.

A twenty-second aspect of the invention is an apparatus for forming an electric circuit on a construction member of a machine based on a set of three-dimensional data, the data used to determine a position and a profile of the construction member, a position of the electric circuit, and a shape of the electric circuit, the electric circuit used for electrical connection between electric instruments mounted on the machine, wherein the data is associated with a reference coordinate system provided in the machine, and the data includes coordinates of points for determining arrangement of the electric circuit, a distance between any two of the points adjacent to each other, and a cross-sectional area of the electric circuit associated with each of the distances, the apparatus comprising a storage means for storing the data, a jet means for jetting an electrically conductive paste which includes a metal, a resin, and a solution for dissolving the resin, a first transfer means for moving the construction member relative to the jet means, and a control means for controlling the jet means and for controlling the relative movement between the construction member and the jet means based on the data, whereby the jet means can jet the molten metal against the construction member so that the electrically conductive paste can be deposited on a surface of the construction member to form the electric circuit on the construction member.

A twenty-fourth aspect of the invention is an apparatus for forming an electric circuit on a construction member of a machine based on a set of three-dimensional data, the data used to determine a position and a profile of the construction member, a position of the electric circuit, and a shape of the electric circuit, the electric circuit used for electrical connection between electric instruments mounted on the machine, wherein the data is associated with a reference coordinate system provided in the machine, and the data includes coordinates of points for determining arrangement of the electric circuit, a distance between any two of the points adjacent to each other, and a cross-sectional area of the electric circuit associated with each of the distances, the apparatus comprising a storage means for storing the data, a data converter means for converting the data to a second set of data associated with a reference coordinate system provided in the construction member, a jet means for jetting a molten metal, a first transfer means for moving the construction member relative to the jet means, and a control means for controlling the jet means and for controlling the relative movement between the construction member and the jet means based on the second set of data, whereby the jet means can jet the molten metal against the construction member so that the molten metal can be deposited on a surface of the construction member to form the electric circuit on the construction member.

A twenty-fifth aspect of the invention is an apparatus for forming an electric circuit on a construction member of a machine based on a set of three-dimensional data, the data used to determine a position and a profile of the construction member, a position of the electric circuit, and a shape of the electric circuit, the electric circuit used for electrical connection between electric instruments mounted on the machine, wherein the data is associated with a reference coordinate system provided in the machine, and the data includes coordinates of points for determining arrangement of the electric circuit, a distance between any two of the points adjacent to each other, and a cross-sectional area of the electric circuit associated with each of the distances, the apparatus comprising a storage means for storing the data, a data converter means for converting the data to a second set of data associated with a reference coordinate system provided in the construction member, a jet means for jetting a molten electrically conductive plastic, a first transfer means for moving the construction member relative to the jet means, and a control means for controlling the jet means and for controlling the relative movement between the construction member and the jet means based on the second set of data, whereby the jet means can jet the molten electrically conductive plastic against the construction member so that the molten electrically conductive plastic can be deposited on a surface of the construction member to form the electric circuit on the construction member.

A twenty-sixth aspect of the invention is an apparatus for forming an electric circuit on a construction member of a machine based on a set of three-dimensional data, the data used to determine a position and a profile of the construction member, a position of the electric circuit, and a shape of the electric circuit, the electric circuit used for electrical connection between electric instruments mounted on the machine, wherein the data is associated with a reference coordinate system provided in the machine, and the data includes coordinates of points for determining arrangement of the electric circuit, a distance between any two of the points adjacent to each other, and a cross-sectional area of the electric circuit associated with each of the distances, the apparatus comprising a storage means for storing the data, a data converter means for converting the data to a second set of data associated with a reference coordinate system provided in the construction member, a jet means for jetting an electrically conductive paste which includes a metal, a resin, and a solution for dissolving the resin, a first transfer means for moving the construction member relative to the jet means, and a control means for controlling the jet means and for controlling the relative movement between the construction member and the jet means based on the second set of data, whereby the jet means can jet the electrically conductive paste against the construction member so that the electrically conductive paste can be deposited on a surface of the construction member to form the electric circuit on the construction member.

A twenty-seventh aspect of the invention is the apparatus as described in the twenty-first aspect further comprising an insulator jetting means for jetting a molten insulating material and a second transfer means moving the insulator jetting means relative to the construction member, wherein the control means makes at least one of the first and second transfer means move the insulator jetting means to jet the molten insulating material against the electric circuit positioned on a surface of the construction member so as to layer the insulating material on the electric circuit.

A twenty-eighth aspect of the invention is the apparatus as described in the twenty-first aspect further comprising an insulator jetting means for jetting an insulating paste which includes an insulating resin and a solution for dissolving the resin, and a second transfer means moving the insulator jetting means relative to the construction member, wherein the control means makes at least one of the first and second transfer means move the insulator jetting means to jet the insulating paste against the electric circuit positioned on a surface of the construction member so as to layer the insulating paste on the electric circuit.

A twenty-ninth aspect of the invention is the apparatus as described in the twenty-second aspect further comprising an insulator jetting means for jetting a molten insulating material and a second transfer means moving the insulator jetting means relative to the construction member, wherein the control means makes at least one of the first and second transfer means move the insulator jetting means to jet the molten insulating material against the electric circuit positioned on a surface of the construction member so as to layer the insulating material on the electric circuit.

A thirtieth aspect of the invention is the apparatus as described in the twenty-second aspect further comprising an insulator jetting means for jetting an insulating paste which includes an insulating resin and a solution for dissolving the resin, and a second transfer means moving the insulator jetting means relative to the construction member, wherein the control means makes at least one of the first and second transfer means and the second transfer means move the insulator jetting means to jet the insulating paste against the electric circuit positioned on a surface of the construction member so as to layer the insulating paste on the electric circuit.

A thirty-first aspect of the invention is the apparatus as described in the twenty-third aspect further comprising an insulator jetting means for jetting a molten insulating material and a second transfer means moving the insulator jetting means relative to the construction member, wherein the control means makes at least one of the first and second transfer means and the second transfer means move the insulator jetting means to jet the molten insulating material against the electric circuit positioned on a surface of the construction member so as to layer the insulating material on the electric circuit.

A thirty-second aspect of the invention is the apparatus as described in the twenty-third aspect further comprising an insulator jetting means for jetting an insulating paste which includes an insulating resin and a solution for dissolving the resin and a second transfer means moving the insulator jetting means relative to the construction member, wherein the control means makes at least one of the first and second transfer means and the second transfer means move the insulator jetting means to jet the insulating paste against the electric circuit positioned on a surface of the construction member so as to layer the insulating paste on the electric circuit.

A thirty-third aspect of the invention is the apparatus as described in the twenty-seventh aspect wherein the control means makes the first transfer means move the jetting means relative to the construction member to jet the molten metal so as to layer the molten metal on the insulator.

A thirty-fourth aspect of the invention is the twenty-ninth aspect wherein the control means makes the one of first and second transfer means move the jet means relative to the construction member to jet the a molten electrically conductive plastic so as to layer the electrically conductive plastic on the insulating material.

A thirty-fifth aspect of the invention is the apparatus as described in the thirty-first aspect wherein the control means makes the one of first and second transfer means move the jet means relative to the construction member to jet the an electrically conductive paste which includes a metal, a resin, and a solution for dissolving the resin so as to layer the electrically conductive paste on the insulating material.

A thirty-sixth aspect of the invention is an apparatus for forming an electric circuit on an insulating intermediate member layered on a construction member of a machine based on a set of three-dimensional data, the data used to determine a position and a profile of the construction member, a position of the electric circuit, and a shape of the electric circuit, the electric circuit used for electrical connection between electric instruments mounted on the machine, wherein the data is associated with a reference coordinate system provided in the machine, and the data includes coordinates of points for determining arrangement of the electric circuit, a distance between any two of the points adjacent to each other, and a cross-sectional area of the electric circuit associated with each of the distances, the apparatus comprising a storage means for storing the data, a jet means for jetting a molten metal, a first transfer means for moving the intermediate member relative to the jet means, and a control means for controlling the jet means and for controlling the relative movement between the intermediate member and the jet means based on the data, whereby the jet means can jet the molten metal against the c intermediate member so that the molten metal can be deposited on a surface of the intermediate member to form the electric circuit on the intermediate member.

A thirty-seventh aspect of the invention is an apparatus for forming an electric circuit on an insulating intermediate member layered on a construction member of a machine based on a set of three-dimensional data, the data used to determine a position and a profile of the construction member, a position of the electric circuit, and a shape of the electric circuit, the electric circuit used for electrical connection between electric instruments mounted on the machine, wherein the data is associated with a reference coordinate system provided in the machine, and the data includes coordinates of points for determining arrangement of the electric circuit, a distance between any two of the points adjacent to each other, and a cross-sectional area of the electric circuit associated with each of the distances, the apparatus comprising a storage means for storing the data, a jet means for jetting a molten electrically conductive plastic, a first transfer means for moving the intermediate member relative to the jet means, and a control means for controlling the jet means and for controlling the relative movement between the intermediate member and the jet means based on the data, whereby the jet means can jet the molten metal against the intermediate member so that the molten electrically conductive plastic can be deposited on a surface of the intermediate member to form the electric circuit on the intermediate member.

A thirty-eighth aspect of the invention is an apparatus for forming an electric circuit on an insulating intermediate member layered on a construction member of a machine based on a set of three-dimensional data, the data used to determine a position and a profile of the construction member, a position of the electric circuit, and a shape of the electric circuit, the electric circuit used for electrical connection between electric instruments mounted on the machine, wherein the data is associated with a reference coordinate system provided in the machine, and the data includes coordinates of points for determining arrangement of the electric circuit, a distance between any two of the points adjacent to each other, and a cross-sectional area of the electric circuit associated with each of the distances, the apparatus comprising a storage means for storing the data, a jet means for jetting an electrically conductive paste which includes a metal, a resin, and a solution for dissolving the resin, a first transfer means for moving the intermediate member relative to the jet means, and a control means for controlling the jet means and for controlling the relative movement between the intermediate member r and the jet means based on the data, whereby the jet means can jet the molten metal against the intermediate member so that the electrically conductive paste can be deposited on a surface of the intermediate member to form the electric circuit on the c intermediate member.

A thirty-ninth aspect of the invention is an apparatus for forming an electric circuit on an insulating intermediate member layered on a construction member of a machine based on a set of three-dimensional data, the data used to determine a position and a profile of the construction member, a position of the electric circuit, and a shape of the electric circuit, the electric circuit used for electrical connection between electric instruments mounted on the machine, wherein the data is associated with a reference coordinate system provided in the machine, and the data includes coordinates of points for determining arrangement of the electric circuit, a distance between any two of the points adjacent to each other, and a cross-sectional area of the electric circuit associated with each of the distances, the apparatus comprising a storage means for storing the data, a data converter means for converting the data to a second set of data associated with a reference coordinate system provided in the construction member, a jet means for jetting a molten metal, a first transfer means for moving the intermediate member relative to the jet means, and a control means for controlling the jet means and for controlling the relative movement between the intermediate member and the jet means based on the second set of data, whereby the jet means can jet the molten metal against the intermediate member so that the molten metal can be deposited on a surface of the intermediate member to form the electric circuit on the intermediate member.

A fortieth aspect of the invention is an apparatus for forming an electric circuit on an insulating intermediate member layered on a construction member of a machine based on a set of three-dimensional data, the data used to determine a position and a profile of the construction member, a position of the electric circuit, and a shape of the electric circuit, the electric circuit used for electrical connection between electric instruments mounted on the machine, wherein the data is associated with a reference coordinate system provided in the machine, and the data includes coordinates of points for determining arrangement of the electric circuit, a distance between any two of the points adjacent to each other, and a cross-sectional area of the electric circuit associated with each of the distances, the apparatus comprising a storage means for storing the data, a data converter means for converting the data to a second set of data associated with a reference coordinate system provided in the construction member, a jet means for jetting a molten electrically conductive plastic, a first transfer means for moving the intermediate member relative to the jet means, and a control means for controlling the jet means and for controlling the relative movement between the intermediate member and the jet means based on the second set of data, whereby the jet means can jet the molten electrically conductive plastic against the intermediate member so that the molten electrically conductive plastic can be deposited on a surface of the intermediate member to form the electric circuit on the intermediate member.

A forty-first aspect of the invention is an apparatus for forming an electric circuit on an insulating intermediate member layered on a construction member of a machine based on a set of three-dimensional data, the data used to determine a position and a profile of the construction member, a position of the electric circuit, and a shape of the electric circuit, the electric circuit used for electrical connection between electric instruments mounted on the machine, wherein the data is associated with a reference coordinate system provided in the machine, and the data includes coordinates of points for determining arrangement of the electric circuit, a distance between any two of the points adjacent to each other, and a cross-sectional area of the electric circuit associated with each of the distances, the apparatus comprising a storage means for storing the data, a data converter means for converting the data to a second set of data associated with a reference coordinate system provided in the construction member, a jet means for jetting an electrically conductive paste which includes a metal, a resin, and a solution for dissolving the resin, a first transfer means for moving the intermediate member relative to the jet means, and a control means for controlling the jet means and for controlling the relative movement between the intermediate member and the jet means based on the second set of data, whereby the jet means can jet the electrically conductive paste against intermediate member so that the electrically conductive paste can be deposited on a surface of intermediate member to form the electric circuit on intermediate member.

A forty-second aspect of the invention is the apparatus as described in the thirty-sixth aspect further comprising an insulator jetting means for jetting a molten insulating material and a second transfer means moving the insulator jetting means relative to the intermediate member, wherein the control means makes at least one of the first and second transfer means move the insulator jetting means to jet the molten insulating material against the electric circuit positioned on a surface of the intermediate member so as to layer the insulating material on the electric, circuit.

A forty-third aspect of the invention is the apparatus as described in the thirty-sixth aspect further comprising an insulator jetting means for jetting an insulating paste which includes an insulating resin and a solution for dissolving the resin and a second transfer means moving the insulator jetting means relative to the intermediate member, wherein the control means makes at least one of the first and second transfer means move the insulator jetting means to jet the insulating paste against the electric circuit positioned on a surface of the intermediate member so as to layer the an insulating paste on the electric circuit.

A forty-fourth aspect of the invention is the apparatus as described in the thirty-seventh aspect further comprising an insulator jetting means for jetting a molten insulating material and a second transfer means moving the insulator jetting means relative to the intermediate member, wherein the control means makes at least one of the first and second transfer means move the insulator jetting means to jet the molten insulating material against the electric circuit positioned on a surface of the intermediate member so as to layer the insulating material on the electric circuit.

A forty-fifth aspect of the invention is the apparatus as described in the thirty-seventh aspect further comprising an insulator jetting means for jetting an insulating paste which includes an insulating resin and a solution for dissolving the resin and a second transfer means moving the insulator jetting means relative to the intermediate member, wherein the control means makes at least one of the first and second transfer means move the insulator jetting means to jet the insulating paste against the electric circuit positioned on a surface of the intermediate member so as to layer the insulating paste on the electric circuit.

A forty-sixth aspect of the invention is the apparatus as described in the thirty-eighth aspect further comprising an insulator jetting means for jetting a molten insulating material and a second transfer means moving the insulator jetting means relative to the intermediate member, wherein the control means makes at least one of the first and second transfer means move the insulator jetting means to jet the molten insulating material against the electric circuit positioned on a surface of the intermediate member so as to layer the insulating material on the electric circuit.

A forty-seventh aspect of the invention is the apparatus as described in the thirty-eighth aspect further comprising an insulator jetting means for jetting an insulating paste which includes an insulating resin and a solution for dissolving the resin and a second transfer means moving the insulator jetting means relative to the intermediate member, wherein the control means makes at least one of the first and second transfer means move the insulator jetting means to jet the insulating paste against the electric circuit positioned on a surface of the intermediate member so as to layer the insulating paste on the electric circuit.

A forty-eighth aspect of the invention is the apparatus as described in the forty-second aspect wherein the control means makes the one of first and second transfer means move the insulator jetting means relative to the intermediate member to jet the molten metal so as to layer the molten metal on the insulating material.

A forty-ninth aspect of the invention is the apparatus as described in the forty-fourth aspect wherein the control means makes the one of first and second transfer means move the insulator jetting means relative to the intermediate member with jetting the molten electrically conductive plastic so as to layer the electrically conductive plastic on the insulating material.

A fiftieth aspect of the invention is the apparatus as described in the forty-sixth aspect wherein the control means makes the one of first and second transfer means move the jet means relative to the intermediate member to jet the electrically conductive paste which includes a metal, a resin, and a solution for dissolving the resin so as to layer the electrically conductive paste on the insulating material.

Next, operation and effects of the invention will be discussed.

In the first to third aspects of the invention, one of the molten metal, the molten electrically conductive plastic, and the electrically conductive paste is deposited on the surface of the construction member to form the electric circuit based on the three-dimensional data determining positions of the construction member and the electric circuit. That is, the electric circuit is used for a wiring harness arranged on the construction member.

This requires no two-dimensional drawing of the wiring harness arranged on the construction member to define the electric circuit and does not need to cut electrical cables each to a desired length. This allows a reduced time/man hour for developing the circuit from a design for a mass production thereof. Thus, in a development step of a new model of the machine, a test electric circuit can be formed with a reduced time, minimizing the test electric circuit in cost for developing it for a mass production thereof.

Furthermore, the cross-sectional area of the electric circuit can be easily selected in the forming method, which eliminates the need for preparing many types of electrical cables.

In the fourth to sixth aspects of the invention, one of the molten metal, the molten electrically conductive plastic, and the electrically conductive paste is deposited on the surface of the construction member to form the electric circuit based on the second set of data related to the coordinate system associated with the construction member. Thus, the electric circuit is defined on the construction member at a desire position of the construction member.

That is, the electric circuit is more reliably used for a wiring harness arranged on the construction member.

Thus, the fourth to sixth aspects of the invention have the same operational effects as the first aspect.

In the seventh aspect of the invention, the insulator prevents the electric circuit defined on the surface of the construction member from an undesirable short-circuit thereof.

In the eighth aspect of the invention, the insulator prevents two of the electric circuits made of the metal from contacting each other when the insulator is disposed between the electric circuits.

In the ninth aspect of the invention, the insulator prevents two of the electric circuits made of the electrically conductive plastic from contacting each other when the insulator is disposed between the electric circuits.

In the tenth aspect of the invention, the insulator prevents two of the electric circuits made of the electrically conductive paste from contacting each other when the insulator is disposed between the electric circuits.

In the eleventh to thirteenth aspects of the invention, one of the molten metal, the molten electrically conductive plastic, and the electrically conductive paste is deposited on the intermediate member fitted on of the construction member to form the electric circuit based on the three-dimensional data determining positions of the construction member and the electric circuit. That is the electric circuit is used for a wiring harness arranged on the construction member.

A plurality of the electric circuit can be arranged on the insulating intermediate member without a short-circuit thereof.

The eleventh to thirteenth aspects of the invention also have the same operational effects as the first aspect.

In the fourteenth to sixteenth aspects of the invention, one of the molten metal, the molten electrically conductive plastic, and the electrically conductive paste is deposited on the intermediate member fitted on of the construction member to form the electric circuit based on the second set of data related to the coordinate system provided in the construction member. Thus, the electric circuit is defined on the construction member at a desire position of the construction member.

That is, the electric circuit is more reliably used for a wiring harness arranged on the intermediate member.

The fourteenth to sixteenth aspects of the invention also have the same operational effects as the first aspect.

In the seventeenth aspect of the invention, the insulator prevents the electric circuit defined on the surface of the intermediate member from an undesirable short-circuit thereof.

In the eighteenth aspect of the invention, the insulator prevents a plurality of electric circuits made of the metal from contacting each other when the insulator is disposed between the electric circuits.

In the nineteenth aspect of the invention, the insulator prevents a plurality of electric circuits made of the electrically conductive plastic from contacting each other when the insulator is disposed between the electric circuits.

In the twelfth aspect of the invention, the insulator prevents a plurality of electric circuits made of the electrically conductive paste from contacting each other when the insulator is disposed between the electric circuits.

In the twenty-first to twenty-third aspects of the invention, one of the molten metal, the molten electrically conductive plastic, and the electrically conductive paste is deposited on the surface of the construction member to form the electric circuit based on the three-dimensional data determining positions of the construction member and the electric circuit. That is the electric circuit is used for a wiring harness arranged on the construction member.

This requires no two-dimensional drawing of the wiring harness arranged on the construction member to define the electric circuit and does not need to cut electrical cables each into a desired length. This allows a reduced time or man hour for developing the electric circuit from a design for a mass production thereof. Thus, in a development step of a new model of the machine, a test electric circuit can be formed with a reduced time, minimizing the test electric circuit in cost to develop it for a mass production thereof.

In the twenty-fourth to twenty-sixth aspects of the invention, one of the molten metal, the molten electrically conductive plastic, and the electrically conductive paste is deposited on the surface of the construction member to form the electric circuit based on the second set of data related to the coordinate system provided in the construction member. Thus, the electric circuit is defined on the construction member at a desired position of the construction member.

That is the electric circuit is more reliably used for a wiring harness arranged on the construction member.

Thus, the twenty-fourth to twenty-sixth aspects of the invention have the same operational effects as the first aspect.

In the twenty-seventh to thirty-second aspects of the invention, the insulator prevents the electric circuit defined on the surface of the construction member from an undesirable short-circuit thereof.

In the thirty-third aspect of the invention, the insulator prevents two of the electric circuit of the metal from contacting each other when the insulator is disposed between the electric circuits.

In the thirty-fourth aspect of the invention, the insulator prevents two of the electric circuits made of the electrically conductive plastic from contacting each other when the insulator is disposed between the electric circuits.

In the thirty-fifth aspect of the invention, the insulator prevents two of the electric circuits made of the electrically conductive paste from contacting each other when the insulator is disposed between the electric circuits.

In the thirty-sixth to thirty-eighth aspects of the invention, one of the molten metal, the molten electrically conductive plastic, and the electrically conductive paste is deposited on the intermediate member fitted on of the construction member to form the electric circuit based on the three-dimensional data determining positions of the construction member and the electric circuit. That is the electric circuit is used for a wiring harness arranged on the construction member.

A plurality of the electric circuit can be arranged on the insulating intermediate member without a short-circuit thereof.

The thirty-sixth to thirty-eighth aspects of the invention also have the same operational effects as the first aspect.

In the thirty-ninth to forty-first aspects of the invention, one of the molten metal, the molten electrically conductive plastic, and the electrically conductive paste is deposited on the intermediate member fitted on of the construction member to form the electric circuit based on the second set of data related to the coordinate system provided in the construction member. Thus, the electric circuit is defined on the construction member at a desired position of the construction member.

That is the electric circuit is more reliably used for a wiring harness arranged on the intermediate member.

The thirty-nine to forty-first aspects of the invention also have the same operational effects as the first aspect.

In the forty-second to forty-seventh aspects of the invention, the insulator prevents the electric circuit defined on the surface of the intermediate member from an undesirable short-circuit thereof.

In the forty-eighth aspect of the invention, the insulator prevents two of the electric circuits made of the metal from contacting each other when the insulator is disposed between the electric circuits.

In the forty-ninth aspect of the invention, the insulator prevents two of the electric circuit made of the electrically conductive plastic from contacting each other when the insulator is disposed between the electric circuits.

In the fifty aspect of the invention, the insulator prevents two of the electric circuit made of the electrically conductive paste from contacting each other when the insulator is disposed between the electric circuits.

Note that the electric circuit described in the specification is used for electrical connection of electrical instruments mounted on a machine construction member and the like, and the resin described in the specification includes a natural resin and a synthetic resin.

DETAILED DESCRIPTION OF THE PREFERRED EMBODIMENTS

Figure 1:
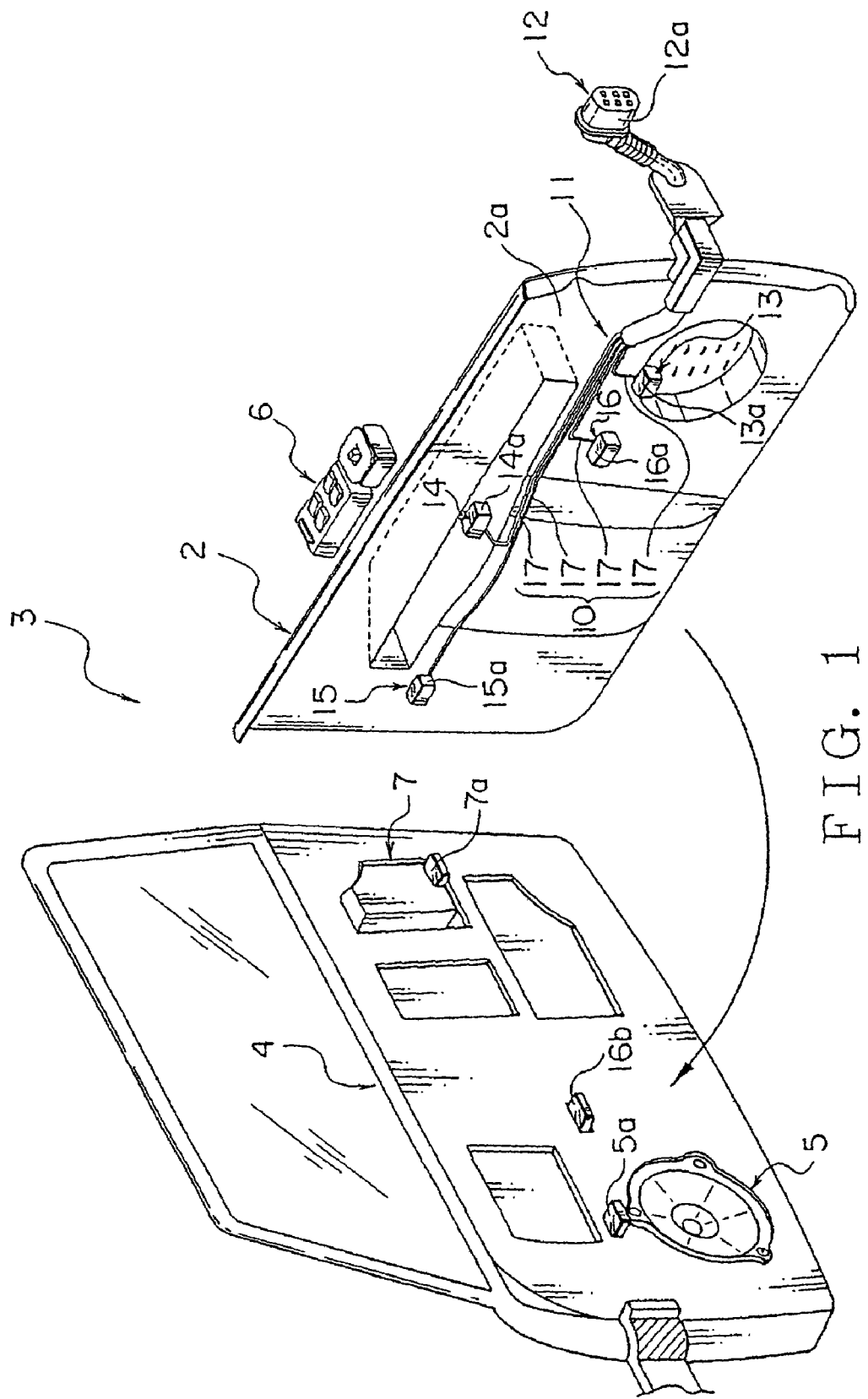
FIG. 1 is an exploded perspective view showing a car door having an electric circuit obtained by an electric circuit forming method according to an embodiment of the present invention.

Referring to FIGS. 1 to 17 and 18, a method and an apparatus for forming an electric circuit, which are embodiments of the present invention, will be discussed. A forming method of one of the embodiments defines an electric circuit 10 on a door trim panel 2 (see FIG. 1) which is a construction member of a car 1 (see FIG. 18).

The car 1 has a door 3 which has a door panel 4, the door trim panel 2, a speaker 5, a power window switch unit 6, a door lock unit 7, a power window switch unit (not shown) and a conduction module 11. The door 3 is pivotably attached to a body 8 (see FIG. 18) of the car 1.

The door panel 4 constitutes partially the outer shell of the car 1. The door panel 4 is a flat metal sheet. The door trim panel 2 is a flat plate made of an insulating synthetic resin material. The door trim panel 2 is disposed inside the door panel 4 generally in parallel with the door panel 4.

The speaker 5 is fitted on the door panel 4 to receive sound signals from a car stereo component so as to provide music sounds to an occupant of the car 1. The power window switch unit 6 is fitted on the door trim panel 2 and is operated by an occupant to make a power window motor move upward and downward a door glass of the door 3. The power window switch unit 6 is further used to lock and unlock the door 3.

The door lock unit 7 is fitted on the door panel 4 to lock and unlock the door 3 according to an operation of the power window switch unit 6. The power window motor moves upward and downward the glass of the door 3 according to an operation of the power window switch unit 6. Note that the speaker 5, the power window switch unit 6, the door lock unit 7, and the power window motor (not shown) correspond to the electrical instruments described in the invention summary.

The conduction module 11 electrically connects the speaker 5, the power window switch unit 6, the door lock unit 7, the power window motor, and other various electronic or electric instruments according to a predetermined pattern. The conduction module 11 delivers an electric power from a battery mounted on the body 8 and control signals from the electronic instruments mounted on the body 8 to the speaker 5, the power window switch unit 6, the door lock unit 7, and the power window motor.

Figure 2:
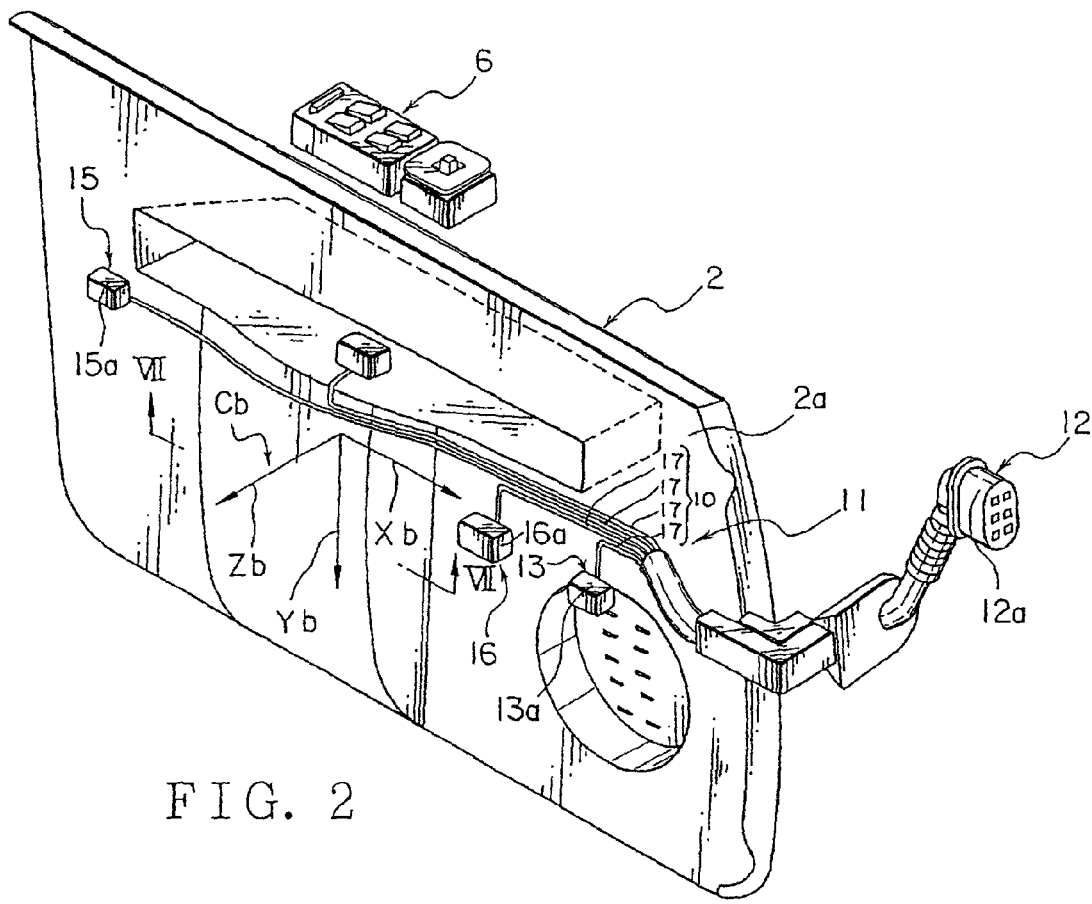
FIG. 2 is a perspective view showing a door trim panel of the door shown in FIG. 1.
Figure 7:
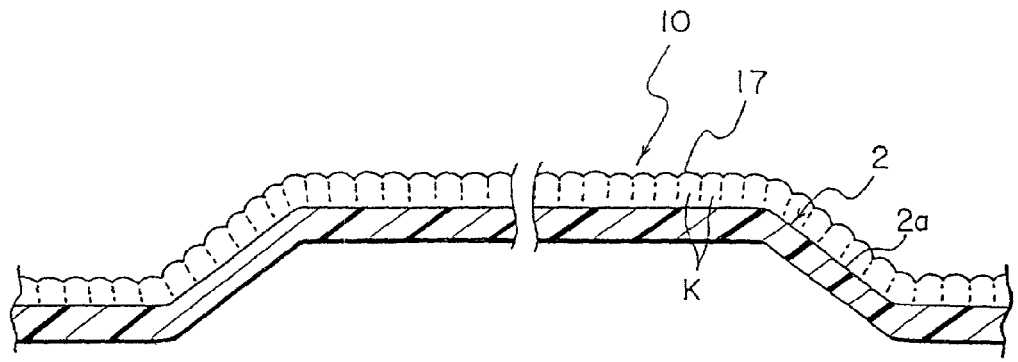
FIG. 7 is a sectional view taken along line VII-VII of FIG. 2.

As illustrated in FIGS. 1 and 2, the conduction module 11 includes an electric circuit 10 consisting of a plurality of electric leads 17, a main connector 12, a speaker connector 13, a switch connector 14, a locking unit connector 15, and a motor connector 16. As illustrated in FIG. 7, each electric lead 17 is disposed on a surface 2a of the door trim panel 2 to be opposed to the door panel 4.

The electric lead 17 is defined in a line and is made of for example an electrically conductive metal such as a soldering material. The electric leads 17 respectively lead to one of the speaker 5, the power window switch unit 6, the door lock unit 7, and the power window motor from a position close to a hinge of the door.

In FIGS. 1 and 2, only four of the electric leads 17 are illustrated, which are respectively connected to the speaker connector 13, the switch connector 14, the locking unit connector 15, and the motor connector 16. It is noted that the electric circuit 10 may be constituted by a necessary number of the electric leads 17 required for electrical connection of electrical and electronic instruments mounted on the door 3.

The connector 12 is positioned near the hinge and has a connector housing 12a accommodating terminal fittings each connected to one end of each electric lead 17. The connector 12 engages with an opposed connector of a main wiring harness arranged on the body 8 of the car 1 so that an electrical power is supplied from the battery to the electric circuit 10.

The speaker connector 13 has a connector housing 13a accommodating terminal fittings each connected to one end of one of electric leads 17 and engages with a connector 5a of the speaker 5 to supply sound signals to the speaker 5.

The switch connector 14 has a connector housing 14a accommodating terminal fittings each connected to one end of one of electric leads 17 and engages with an opposing connector (not shown) of the power window switch unit 6 to supply control signals to the electric circuit 10 according to an operation of the power window switch unit 6.

The locking unit connector 15 has a connector housing 15a accommodating terminal fittings each connected to one end of one of electric leads 17 and engages with an opposing connector 7a of the door lock unit 7 to supply control signals to the electric circuit 10 according to an operation of the power window switch unit 6.

The motor connector 16 has a connector housing 16a accommodating terminal fittings each connected to one end of one of electric leads 17 and engages with an opposing connector 16b of the power window motor to supply control signals to the power window motor according to an operation of the power window switch unit 6.

The conduction module 11 is disposed between the door panel 4 and the door trim panel 2 and is used to move the door glass upward and downward and to lock and unlock the door.

Figure 3:
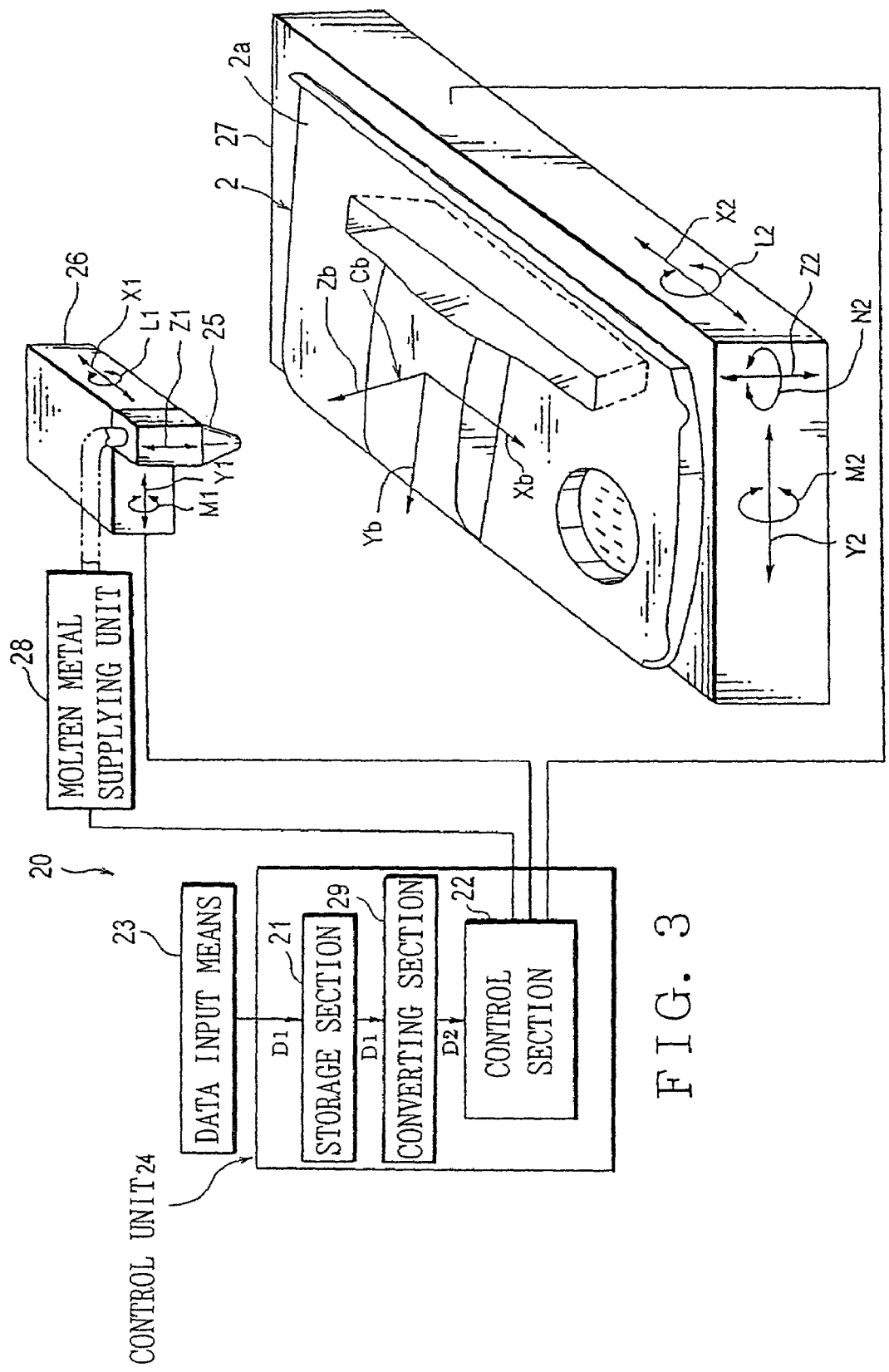
FIG. 3 is a perspective view showing a forming apparatus for defining an electric circuit on the door trim panel of the door of FIG. 1.

The electric circuit 10 of thus configured conduction module 11 is defined on the surface 2a of the door trim panel 2 by means of an electric circuit forming apparatus 20 shown in FIG. 3. The electric circuit forming apparatus 20 has a nozzle 25 as a jet means, a nozzle transfer unit 26, a deposition object transfer unit 27, and a control unit 24.

Figure 5:
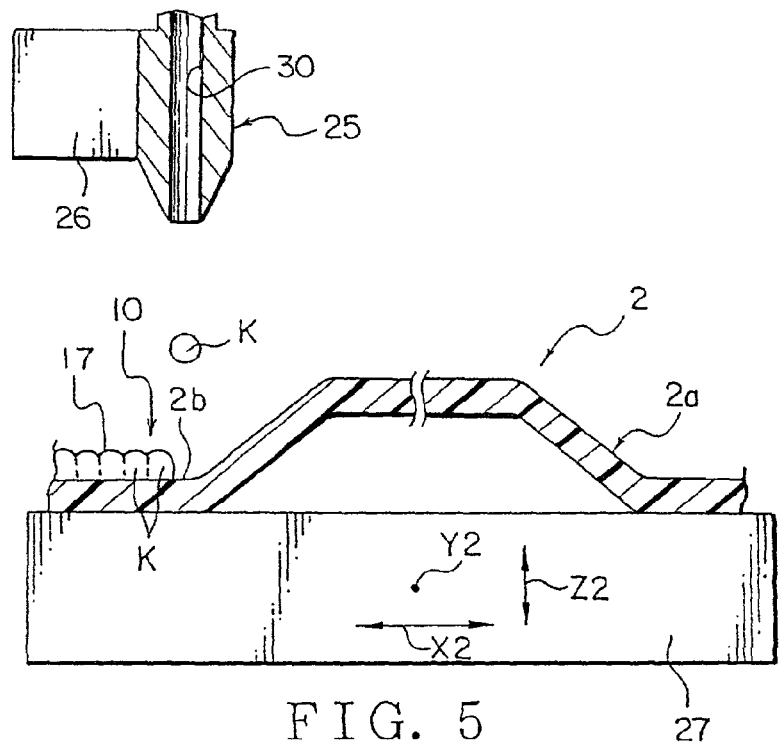
FIG. 5 is a sectional view illustrating a state in which the forming apparatus of FIG. 3 jets a molten metal against the door trim panel.
Figure 6:
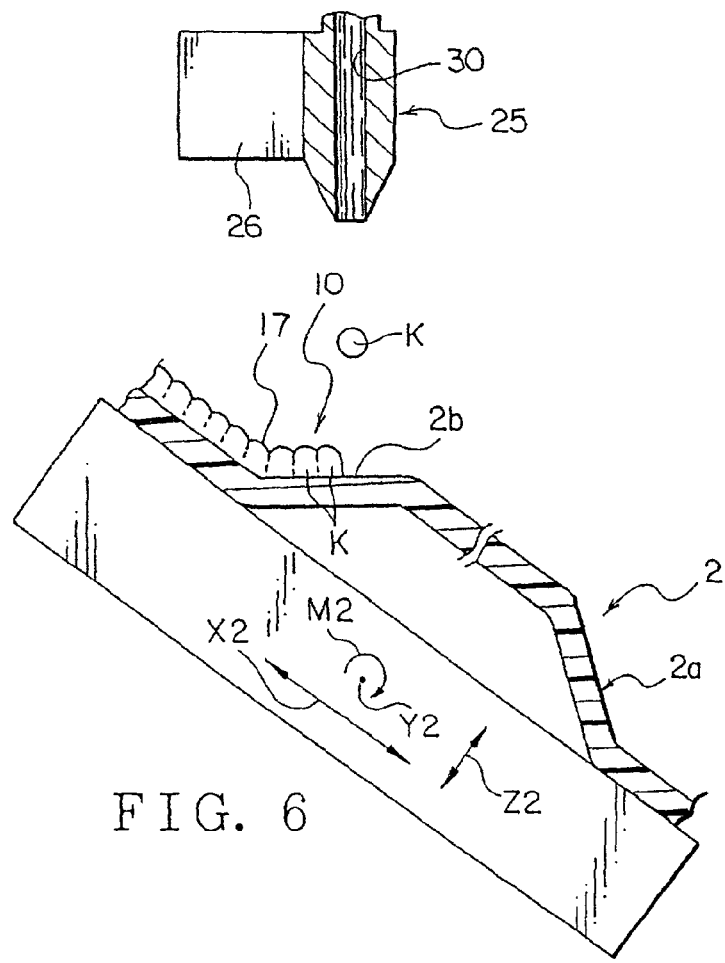
FIG. 6 is a sectional view illustrating another state in which the forming apparatus of FIG. 3 jets a molten metal against the door trim panel.

As illustrated in FIGS. 5 and 6, the nozzle 25 has a hole 30 that passes a predetermined amount of a molten electrical conductive molten metal K every shot of the nozzle 25. The nozzle 25 is connected to a molten metal supplying unit 28 to supply the molten metal K to the hole 30. The hole 30 extends vertically and has an opening at a lower end thereof. The molten metal supplying unit 28 contains the conductive metal in powder or in fiber, and the conductive metal is molten to be supplied into the hole 30 of the nozzle 25.

The nozzle 25 jets intermittently the predetermined amount of molten metal K against the door trim panel 2 to define a row of metal grains through the hole 30 in the use of a compressed air or a piezoelectric element. The door trim panel 2 is mounted on a deposition object transfer unit 27. The nozzle 25 jets the molten metal K vertically downward. The molten metal K may be a soldering material or the like.

The predetermined amount of molten metal K jetted by one shot of the nozzle 25 is selected not to cause a damage in the door trim panel 2 when the molten metal K is deposited on the surface 2a of the door trim panel 2. The amount of molten metal K jetted by one shot of the nozzle 25 needs to have a sufficient amount of heat. However, too much of the heat of the molten metal K will dissolve the door trim panel 2 to cause a damage of the door trim panel 2.

The interval of the intermittent shots is determined such that adjacent grains of the molten metal K deposited on the surface 2a of the door trim pane 2 mix with each other. That is a next shot is carried out before hardening of a grain deposited on the surface 2a by the latest shot, so that adjacent grains of the molten metal K deposited on the surface 2a are well continuous with each other not to cause disconnection in the electric lead 17.

The nozzle 25 is mounted on a nozzle transfer unit 26 which moves the nozzle 25 along each of arrows X1, Y1, Z1, L1, and M1 shown in FIG. 3. The arrows X1, Y1, and Z1 intersect each other, perpendicularly particularly in the illustrated example.

The arrow Z1 extends vertically, while the arrow X1 and the Y1 extend horizontally. The arrow L1 directs in a circumferential direction around the arrow X1, while the arrow M1 directs in a circumferential direction around the arrow Y1.

The deposition object transfer unit 27 that retains an object to receive the molten metal K is positioned in a lower side of the nozzle transfer unit 26 having the nozzle 25. In the illustrated example, the deposition object transfer unit 27 moves the object, which is the door trim panel 2, along each of arrows X2, Y2, Z2, L2, M2, and N2.

The arrows X2, Y2, and Z2 intersect each other, perpendicularly particularly in the illustrated example. The arrow Z2 extends vertically in parallel with the arrow Z1, while the arrow X2 and the Y2 extend horizontally. The arrow X1 and X2 are parallel to each other, and the arrow Y1 and Y2 are parallel to each other. The arrow L1 directs in a circumferential direction around the arrow X1, while The arrow M1 directs in a circumferential direction around the arrow Y1.

The arrow L2 directs in a circumferential direction around the arrow X2, the arrow M2 directs in a circumferential direction around the arrow Y2, and the arrow N2 directs in a circumferential direction around the arrow Z2.

The nozzle transfer unit 26 and the deposition object transfer unit 27 cooperate with each other to move the nozzle 25 and the door trim pane 12 relative to each other such that the hole 30 of the nozzle 25 is opposed to a desired section 2b (see FIGS. 5 and 6) of the door trim panel 2. Moreover, as illustrated in FIGS. 5 and 6, in the relative movement of the nozzle transfer unit 26 and the deposition object transfer unit 27, the hole 30 is directed in a direction perpendicular to the section 2b of the door trim panel 2. FIG. 6 shows a state in which the deposition object transfer unit 27 is moved along the arrow M1 around arrow Y2 from another state shown in FIG. 5.

The nozzle transfer unit 26 and the deposition object transfer unit 27 correspond to the first transfer means described in the invention summary. The nozzle transfer unit 26 and the deposition object transfer unit 27 each may be a six-axis motion apparatus having six extendable cylinder units.

The control unit 24 is a known computer having a CPU, a ROM, and a RAM. The control unit 24 is electrically connected to the nozzle transfer unit 26, the deposition object transfer unit 27, the molten metal supplying unit 28, etc. to control them and to serve the whole control of the electric circuit forming apparatus 20.

The control unit 24 has a storage section 21 of a storage means, a converting section 29 as a data conversion means, and a control section 22 as a control means. The storage section 21 stores a set of three-dimensional data D1 based on a coordinate system Ca of the car 1 shown in FIG. 12. The data D1 defines positions of the door trim panel 2, a shape of the door trim panel 2, positions of the electric circuit 10 for connection among the electrical instruments 5, 6, and 7, and a shape of the electric circuit 10.

At a design step of the car 1, there is prepared a set of data determining a position and a shape each of construction members, electrical instruments, parts, and electric circuits for connection among the instruments. The three-dimensional data D1 based on a coordinate system Ca of the car 1 is a part of the whole data prepared at the design step of the car 1.

The positions and the shape of the electric circuit 10 include a plurality of points on which the electric circuit 10 passes, a distance between any adjacent two of the points, and a cross sectional area of an electric lead 17 of the electric circuit 10 extended between the two points. The cross sectional area is associated with a lateral section of the electric lead 17 which is perpendicular to an extending direction of the electric lead 17.

Figure 18:
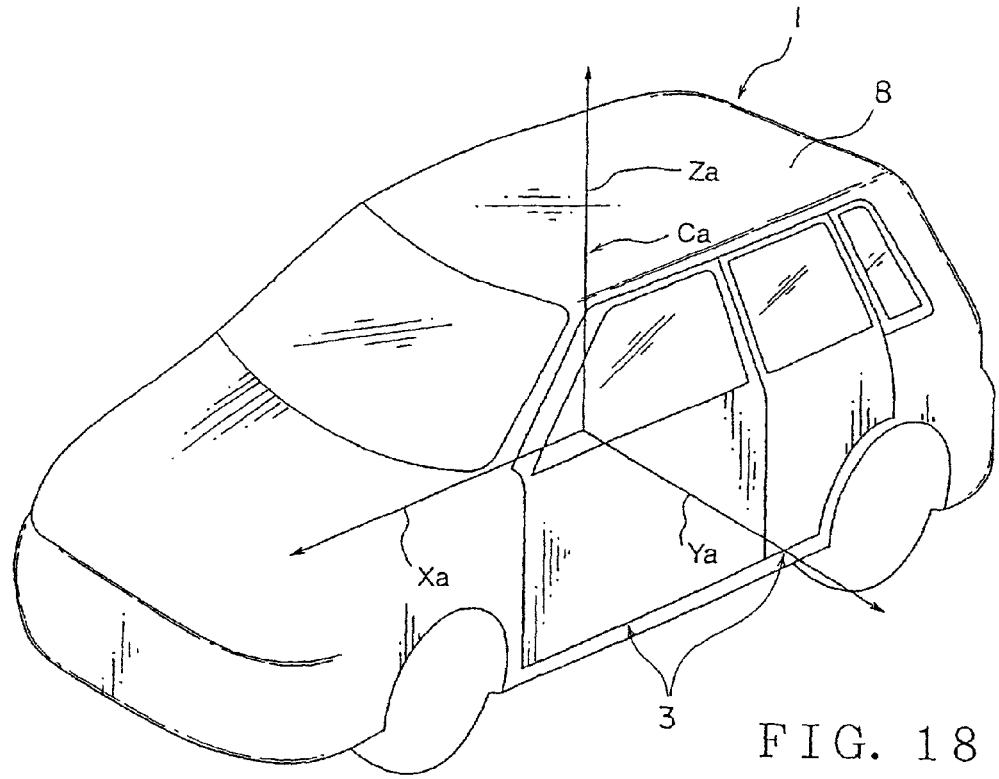
FIG. 18 is a perspective view showing a coordinate system related to a car having the door shown in FIG. 1.
Figure 14A:
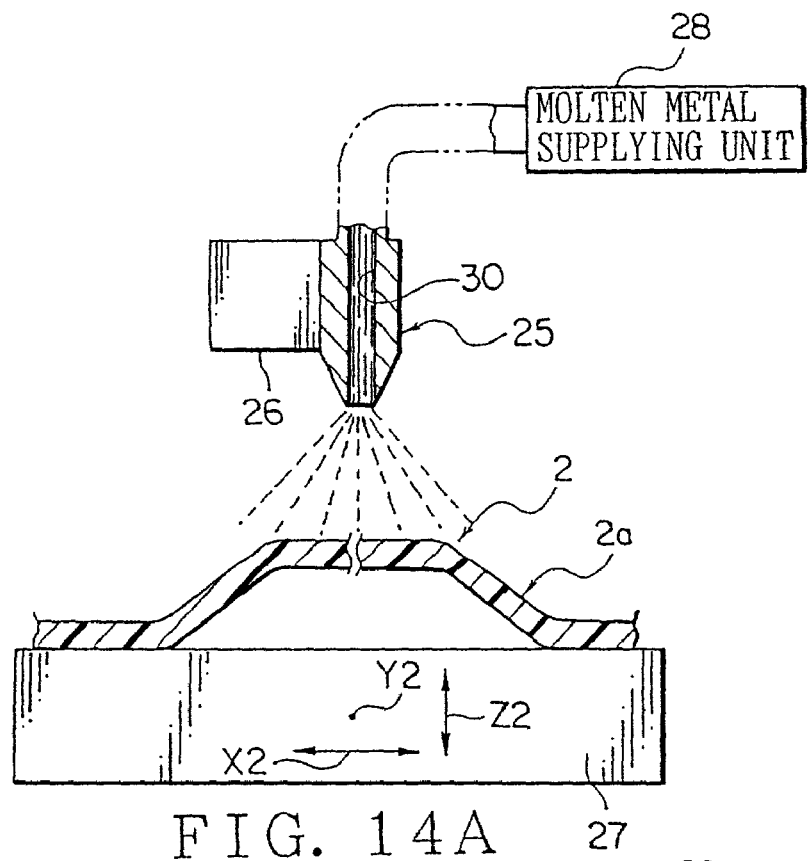
FIGS. 14A and 14B each are a sectional view showing primary parts of another modified example of the electric circuit forming apparatus of FIG. 3.
Figure 14B:
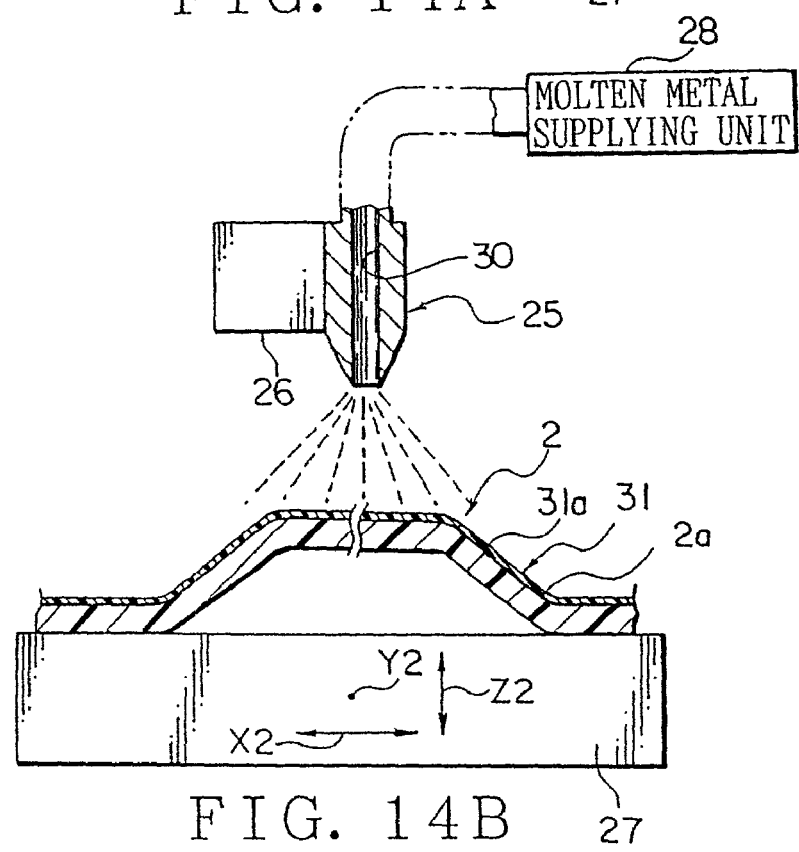

The coordinate system Ca is provided based on the car 1. The coordinate system Ca is defined for example by a X-axis Xa extending in a longitudinal direction of the car 1, a Y-axis Ya extending in a lateral direction of the car 1, and a Z-axis Za extending in a vertical direction of the car 1 as illustrated in FIG. 18. The origin of the coordinate system Ca at which axes Xa, Ya, Za intersect one another can be located at any position of the car 1.

The storage section 21 stores the data D1 determining the positions and the shape of the door trim panel 2 of the door 3 which is one of the construction members of the car 1 and the positions and the shape of the electric circuit 10 based on the coordinate system Ca of the car 1.

The converting section 29 converts the data D1 based on the coordinate system Ca to a second set of data D2 based on a coordinate system Cb (see FIG. 2) associated with each construction member. The second set of data D2 may be based on another coordinate system associated with an intermediate member like an insulating described later. The illustrated coordinate system Cb is based on the door trim panel 2. That is the second set of data D2 includes the positions and the shape of the electric circuit 10, a distance between any adjacent two of the points, and a cross sectional area of an electric lead 17 of the electric circuit 10 extended between the two points.

Such a second set of data D2 is defined respectively for each of the construction members of the car 1. Each second set of data D2 define positions relative to each construction member, lengths, and diameters of the electric circuit 10. In the example of the door trim panel 2 illustrated in FIG. 2, the coordinate system Cb is defined by a X-axis Xb extending in a longitudinal direction of the door trim panel 2, a Y-axis Yb extending in a lateral direction of the door trim panel 2, and a Z-axis Zb extending in a vertical direction of a surface 2a of the door trim panel 2. The axes Xa, Ya, and Za intersect perpendicularly to one another.

Thus, the converting section 29 converts the data D1 based on the coordinate system Ca to the second set of data D2 based on the coordinate system Cb Based on the second set of data D2 of the door trim panel 2, the control section 22 controls the nozzle transfer unit 26, the deposition object transfer unit 27, and the molten metal supplying unit 28 to move the door trim panel 2 and the nozzle 25 relative to each other while the nozzle 25 intermittently jets a molten metal K against the door trim panel 2 or the insulating . That is the control section 22 operates such that the molten metal K is deposited on the door trim panel 2 or the insulating in consideration of the positions and the shape of the door trim panel 2 of the car 1 and the positions and the shape of the electric circuit 10.

The control section 22 controls the nozzle 25 such that the nozzle 25 intermittently jets the molten metal K by a fixed amount to define the electric circuit 10 on the surface 2a of the door trim panel 2.

The control unit 24 has the storage section 21 connected to an input means 23 for the data D1 that is a set of three-dimensional data of the door trim panel 2 and the electric circuit 10 based on the coordinate system Ca of the car 1. The input means 23 can input the data D1 in the storage section 21. The input means 23 may be a record-medium reading unit such as a CD-ROM reading unit.

Figure 4:
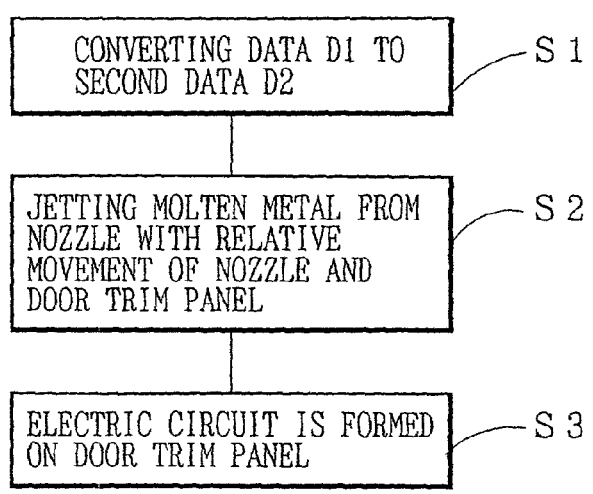
FIG. 4 is a flowchart showing steps for defining an electric circuit in the use of the forming apparatus of FIG. 3.

Referring to steps for defining the electric circuit 10 on the door trim panel 2 of the car 1 in the use of the electric circuit forming apparatus 20 of the embodiment, first, the data D1 determining the positions and the shape of the door trim panel 2 and the electric circuit 10 based on the coordinate system Ca of the car 1 is stored in the storage section 21 through the input means 23. Next, as illustrated in FIG. 4, a step S1 is carried out so that the converting section 29 converts the data D1 based on the coordinate system Ca to the second set of data D2 based on the coordinate system Cb associated with the door trim panel 2 before execution of a step S2.

In the step S2, the control section 22 moves the nozzle transfer unit 26 and the deposition object transfer unit 27 based on the second set of data D2 while the nozzle 25 jets intermittently the molten metal K against the door trim panel 2. In a next step S3, the jetted molten metal K defines a continuous grains of the molten metal K which are deposited on the surface 2a of the door trim panel 2 to provide the electric circuit 10 on the surface 2a.

In the embodiment, the molten metal K is jetted to be deposited on the door trim panel 2 of the car 1 to define the electric circuit 10. The electric circuit 10 is used as a wiring harness for connection among the electrical instruments 5, 6, and 7 mounted on the door trim panel 2 and the door panel 4. In the electric circuit forming apparatus 20, the molten metal supplying unit 28 heats and dissolves a powder or fiber metal like a soldering material, and the nozzle 25 jets the molten metal to deposit it on the door trim panel 2 or on the insulating sheet 31 described later.

The molten metal K is deposited on the door trim panel 2 or the insulating sheet 31 based on the three-dimensional data determining positions of the door trim panel 2 and the electric circuit 10. This requires no two-dimensional drawing of the electric circuit 10 to define the electric circuit 10 and does not need to cut electrical cables each in a desired length.

This allows a reduced time or man hour for developing an electric circuit from a design for a mass production thereof. Thus, in a development step of a new model of the car 1, a test electric circuit can be formed within a reduced time, minimizing the test electric circuit in cost.

Furthermore, in the embodiment, the data D1 based on the coordinate system Ca of the car 1 is converted to the second set of data D2 based on the coordinate system Cb of the door trim panel 2 to define the electric circuit 10 thereon. The molten metal K is deposited on the surface 2a of the door trim panel 2 to form the electric circuit 10 based on the second set of data D2. Thus, the electric circuit 10 defined on the door trim pane 2 at a desired position of the door trim panel 2. That is the electric circuit 10 is more reliably used for a wiring harness arranged on the door trim panel 2.

This requires no two-dimensional drawing of the electric circuit 10 to define the electric circuit 10. This allows a reduced time or man hour for developing the electric circuit 10 from a design for a mass production thereof.

The nozzle transfer unit 26 and the deposition object transfer unit 27 move the nozzle 25 and the door trim panel 2 such that the hole 30 directs perpendicular to an opposed portion 2b of the door trim panel 2 based on the second set of data D2 of the coordinate system Cb as illustrated in FIGS. 5 and 6. Furthermore, the hole 30 is directed vertically downward so that the metal grains deposited on the surface 2a are correctly positioned. Thus, the molten metal K is reliably deposited on the door trim panel 2 at a desired position thereof.

Figure 8A:
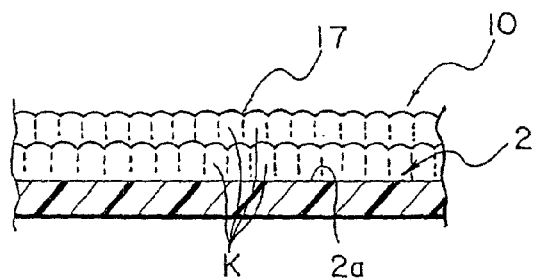
FIGS. 8A and 8B each are a sectional view showing a modified example of a conductor of an electric circuit obtained by a forming method according to the present invention.

As illustrated in FIG. 8A, the molten metal K is jetted against the door trim panel 2 such that the deposited metal grains partially overlap one another. A desired cross-sectional area of the electric lead 17 of the electric circuit 10 can be easily achieved, which eliminates the need for preparing many types of electrical cables to provide the electric circuit 10 arranged on the car 1.

Figure 8B:
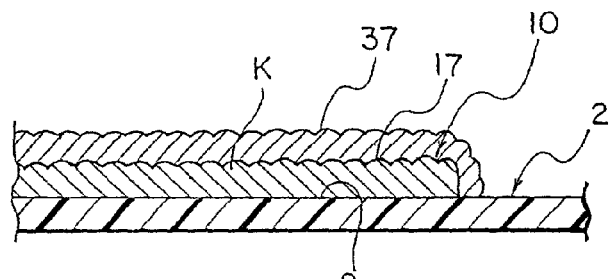

As illustrated in FIG. 8B, the electric circuit 10 defined on the door trim panel 2 may be overlapped by an insulator 37 to cover the electric lead 17 of the electric circuit 10. This prevent an undesired short circuit between the electric lead 17 of the electric circuit 10 and the door panel 4 or another conductive member.

Figure 9A:
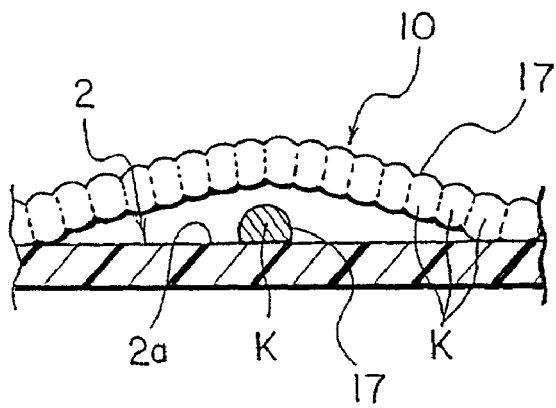
FIGS. 9A and 9B each are a sectional view showing another modified example of a conductor of an electric circuit obtained by the a forming method according to the present invention.

As illustrated in FIG. 9A, a plurality of the electric leads 17 can cross each other with a space therebetween by adjusting the interval and quantity of the shot of the molten metal K. This improves the flexibility of an arrangement design of the electric circuit 10.

Figure 9B:
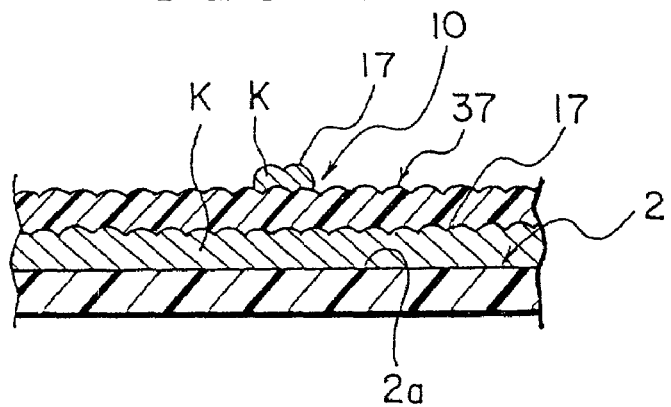

As illustrated in FIG. 9B, the insulator 37 is preferably disposed between two electric leads 17 crossing with each other. That is, continuous metal grains are deposited on the insulator 37 overlaid on the electric circuit 10 to define an electric lead 17 thereon. The insulator 37 reliably prevents an undesired short circuit between the crossing electric leads 17. This crossing of the electric leads 17 improves the flexibility of an arrangement design of the electric circuit 10.

Figure 12:
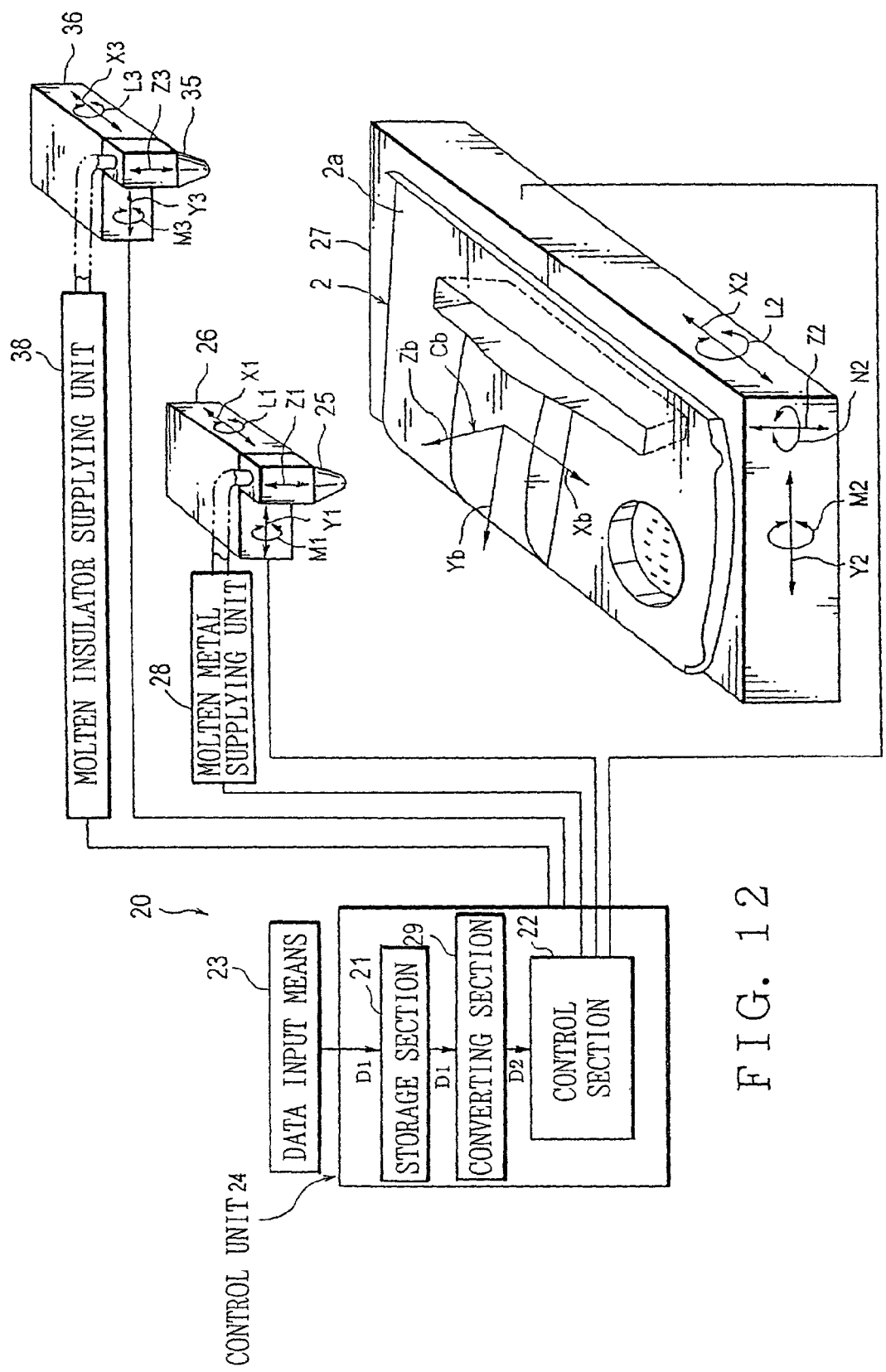
FIG. 12 is a perspective view showing a configuration of a modified example of the electric circuit forming apparatus of FIG. 3.

When the insulator 37 is used as illustrated in FIGS. 8B and 9B, another electric circuit forming apparatus 20 illustrated in FIGS. 12 is prepared, in which the same component is designated by the same reference numeral as the electric circuit forming apparatus 20 shown in FIG. 3 and will not be discussed again. The electric circuit forming apparatus 20 of FIG. 12 has an insulator nuzzle 35 and an insulator nozzle transfer unit 36, which correspond to the insulator jetting means and the second transfer means described in the invention summary.

The insulator nuzzle 35 has a configuration almost the same as that of the nozzle 25. The insulator nuzzle 35 has a jet hole for jetting a molten insulator G. The insulator nuzzle 35 communicates with the molten insulator supplying unit 38 for supplying intermittently a fixed amount of the molten insulator G. The molten insulator supplying unit 38 contains an insulator resin like a synthetic resin in powder or in fiber, which is molten to be delivered to the insulator nuzzle 35.

The insulator nuzzle 35 jets intermittently a fixed amount ? of grains of the molten insulator G against the door trim panel 2 mounted on the deposition object transfer unit 27 in the use of a compressed gas or a piezoelectric element. The insulator nuzzle 35 jets the insulator G vertically downward. As well as the molten metal K jetted by the nozzle 25, the jetting amount rate of the insulator G by the insulator nuzzle 35 is determined not to cause a damage in the door trim panel 2 when the insulator G is deposited on the surface 2a of the door trim panel 2.

The insulator nuzzle 35 is mounted on the insulator nozzle transfer unit 36. The insulator nozzle transfer unit 36 can move the insulator nuzzle 35 along any of the arrows X3, Y3, Z3, L3, and M3 of FIG. 12. The arrows X3, Y3, and Z3 intersect with each other, perpendicularly in the illustrated example.

In the illustrated example, the arrow Z3 is extended vertically, while the arrows X3 and Y3 are extended horizontally. The arrow L3 directs in a circumferential direction around the arrow X3. The arrow M3 directs in a circumferential direction around the arrow Y3.

The insulator nozzle transfer unit 36 moves the insulator nuzzle 35 relative to the door trim panel 2 mounted on the deposition object transfer unit 27. As well as nozzle transfer unit 26 and the deposition object transfer unit 27, the insulator nozzle transfer unit 36 maybe a six-axis motion unit having six extendable cylinders.

Figure 13:
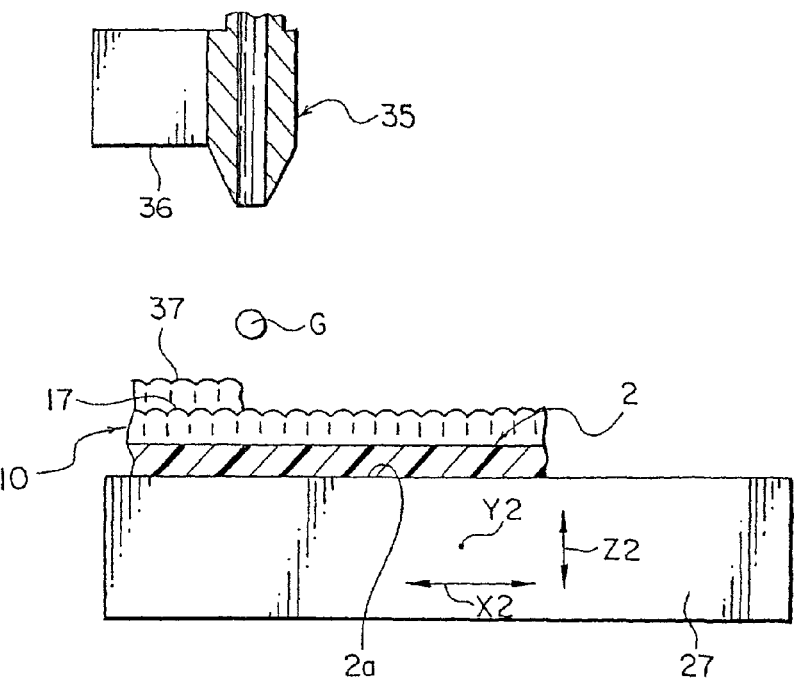
FIG. 13 is a sectional view illustrating a state in which the forming apparatus of FIG. 12 jets a molten insulator against an electric circuit.

As illustrated in FIG. 13, while the deposition object transfer unit 27 and insulator nozzle transfer unit 36 are moved relative to each other based on the data D1 or the second set of data D2, the control section 22 of the control unit 24 makes the insulator nuzzle 35 jet the molten insulator G against the door trim panel 2 and the electric lead 17 defined by the metal grains. Thereby, the molten insulator G is deposited on the electric lead 17, so that the insulator 37 covers the electric lead 17. Thus, in the electric circuit forming apparatus 20, the molten insulator supplying unit 38 heats and dissolves a resin like a synthetic resin in powder or in fiber, and the molten resin is jetted from the insulator nuzzle 35 in the use of a compressed gas to overlay on the electric lead 17.

Figure 11:
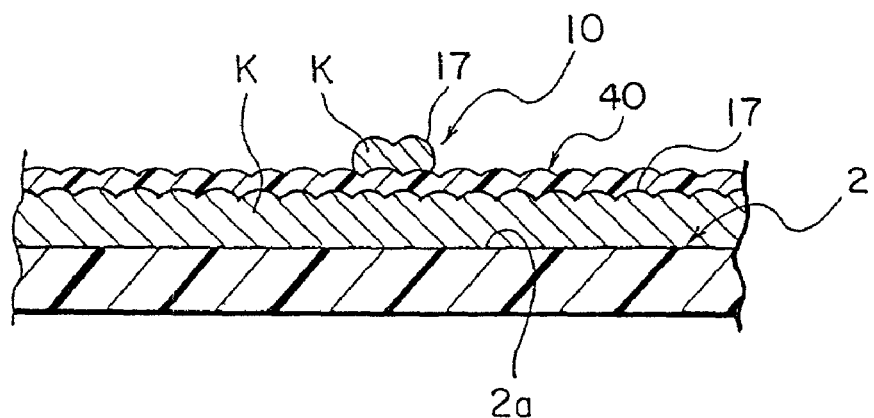
FIG. 11 is a sectional view showing another modified example of an electric circuit defined on the door panel of FIG. 1.

In place of the overlaying of the molten insulator G, an insulating sheet 40 may be overlaid on the electric circuit 10 as illustrated in FIG. 11. The sheet 40 may be made of an insulating synthetic resin. On the sheet 40, a molten metal K may be further deposited to define another electric circuit 10.

In the aforementioned embodiment, the molten metal K is deposited on the door trim panel 2 of the car 1 to define the electric circuit 10. However, as illustrated in FIG. 10, when the door panel 4 is made of an electrically conductive material, the molten metal K may be deposited on an intermediate member constituted by an insulating sheet 31 laid on the door panel 4 to define an electric circuit 10.

Figure 10:
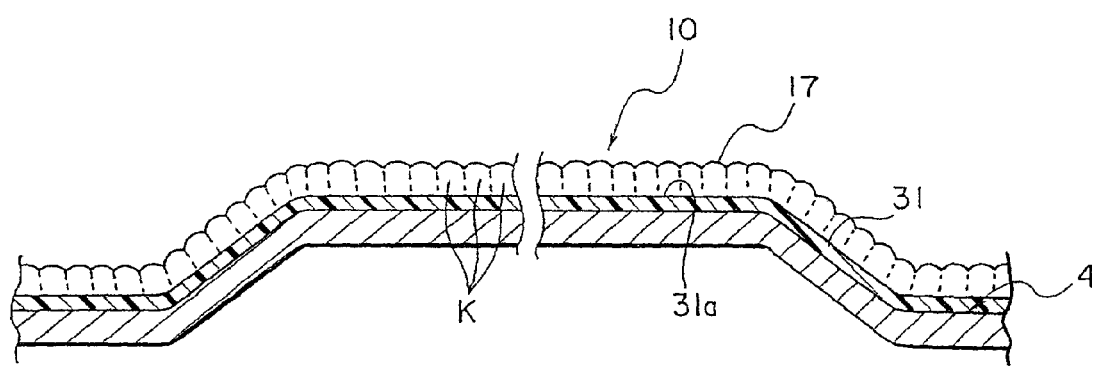
FIG. 10 is a sectional view showing a modified example of an electric circuit defined on a door panel of FIG. 1.

In an example illustrated in FIG. 10, the insulating sheet 31 is a thin sheet made of a synthetic resin material and is laid on the door panel 4. The data D1 based on the coordinate system Ca and obtained after the designing of the car 1 is converted to the second set of data D2. The coordinate system Cb for the second set of data D2 is based on the door trim panel 2 or the insulating sheet 31.

On the deposition object transfer unit 27, the door panel 4 having the insulating sheet 31 is mounted. Based on the second set of data D2, the nozzle transfer unit 26 and the deposition object transfer unit 27 move the nozzle 25 and the insulating sheet 31 relative to each other, while the molten metal K is deposited on a surface 31a of the insulating sheet 31 to define the electric circuit 10.

Thus, the electric circuit 10 is surely defined at a desired position on the door panel 4. That is the electric circuit 10 is used for a wiring harness arranged on the door panel 4. The molten metal K deposited on the surface 31a of the insulating sheet 31 to define the electric circuit 10 allows a reduced time and man hour for developing the door panel 4 from a design for a mass production thereof. A plurality of the electric leads 17 defined on surface 31a are well insulated from each other.

In place of the insulating sheet 31, an insulating resin material may be directly coated on a machine construction member of made of an electrically conductive material before the forming of the electric circuit 10. For example, a molten insulator G like an aerosol may be jetted against the surface 2a of the door trim panel 2 in the use of a compressed air. Furthermore, a plate-shaped insulating member may be used in palace of the insulating sheet 31.

The insulating sheet 31 or the plate-shaped insulating member may be provided on the construction member after an electric circuit is defined on the construction member. An electric circuit may be defined on the insulating sheet 31 or the plate-shaped insulating member after the insulating sheet 31 or the plate-shaped insulating member is disposed on the construction member.

The electric circuit forming apparatus 20 shown in FIG. 12 can be used to deposit the insulator 37 on the intermediate insulating sheet 31 to define the electric circuit 10. The electric lead 17 may be covered by the insulator 37, and the insulator 37 may be disposed between a plurality of electric leads 17 intersecting with each other to insulate them from one another.

The electric circuit forming apparatuses 20 illustrated in FIGS. 3 and 12 jet intermittently a fixed amount of the molten metal K against the door trim pane 12 or the insulating sheet 31 to define the electric circuit 10. Alternatively, as illustrated by dotted lines of FIGS. 14A and 14B, an aerosol of the molten K and a compressed air may be jetted against the door trim panel 2 or the insulating sheet 31 to define the electric circuit 10. Preferably, a mask is provided for the door trim panel 2 or the insulating sheet 31 to prevent the scattering of the molten metal K. The mask has a through hole which passes the molten metal K to deposit it on the door trim panel 2 or the insulating sheet 31.

The electric circuit forming apparatuses 20 illustrated in FIGS. 3 and 12 can be used to define the electric lead 17 or the insulator 37 on the door trim panel 2 or the insulating sheet 31, in which a cold spray method may be utilized. To define the electric lead 17, a compressed gas having a temperature lower than a melting or softening temperature of the metal composing the electric lead 17 is jetted from the nozzle 25 with an ultrasonic speed. Grains of the metal are entrained in the ultrasonic speed flow of the gas in the nozzle 25. The metal grains are kept in solid when jetted against the door trim panel 2 or the insulating sheet 31 to define the electric lead 17 of the electric circuit 10.

To define the insulator 37, a compressed gas having a temperature lower than a melting or softening temperature of the resin composing the insulator 37 is jetted from the insulator nozzle 35 with an ultrasonic speed. Grains of the resin are entrained in the ultrasonic speed flow of the gas in the insulator nozzle 35. The resin grains are kept in solid when jetted against the electric lead 17 to define the insulator 37.

The cold spray method allows a low heat quantity of each grain of the metal or the resin, preventing a damage of the door trim panel 2 or the insulating sheet 31.

The electrically conductive plastic is a plastic material including a metal in powder or in whisker distributed therein to have an electrical conductivity, or the electrically conductive plastic may be an organic electrically conductive high-molecular compound such as a high-molecular charge-transfer complex and a high-molecular electrolyte. The high-molecular compound is, for example, polyacethylene.

Figure 15A:
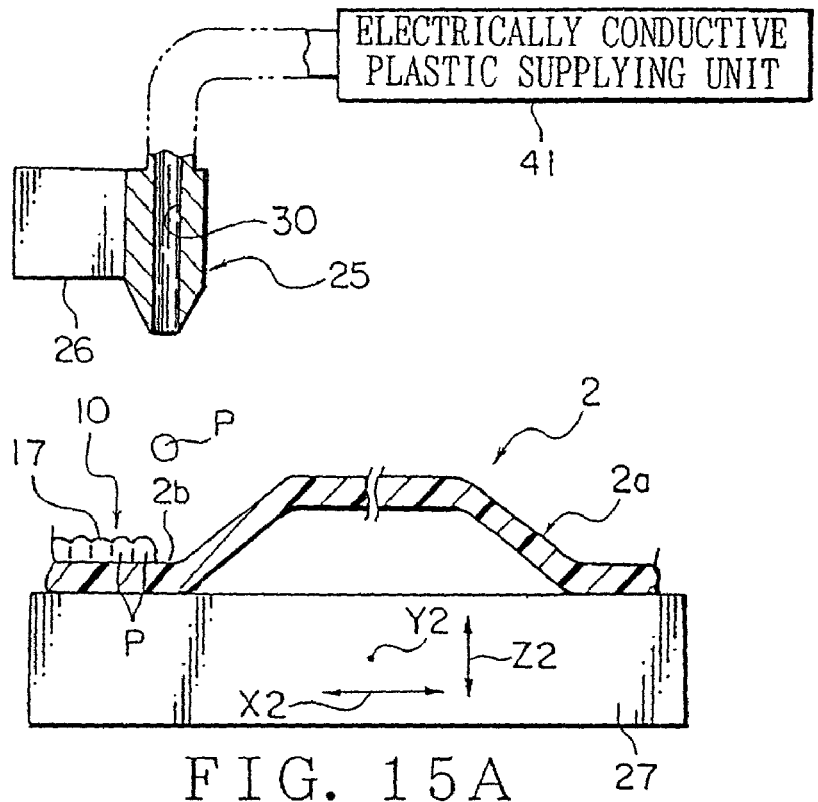
FIGS. 15A and 15B each are a perspective view showing primary parts of further another modified example of the electric circuit forming apparatus of FIG. 3.
Figure 15B:
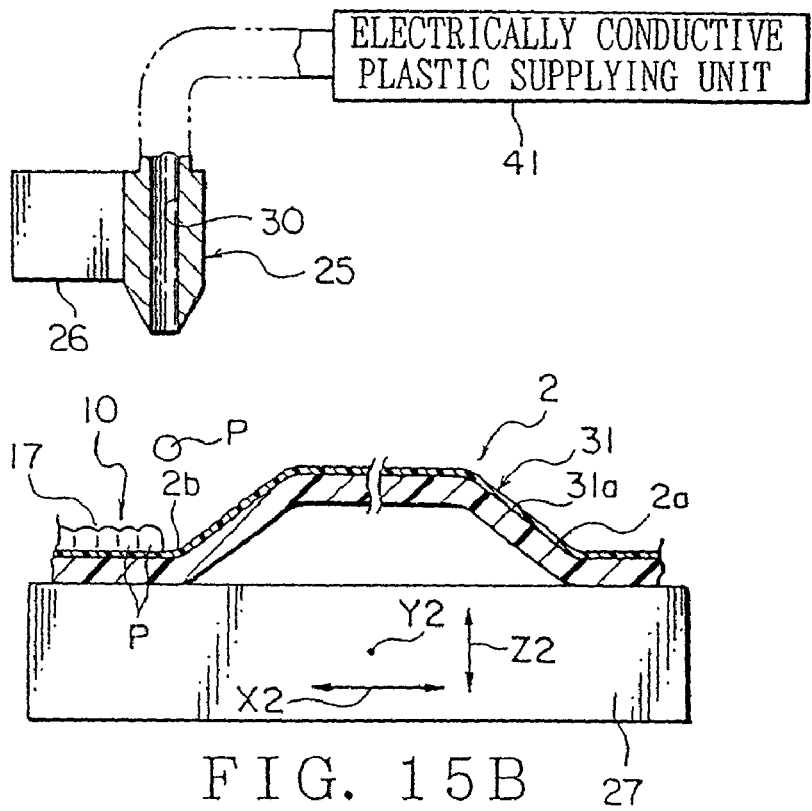

In an example illustrated in FIG. 15A or FIG. 15B, the electrically conductive plastic P molten by the electrically conductive plastic supplying unit 41 is intermittently jetted from the hole 30 of the nozzle 25 against the door trim panel 2 or the insulating sheet 31. Grains of the electrically conductive plastic are deposited on the surface 2a of the door trim panel 2 or on the insulating sheet 31 to define the electric lead 17 of the electric circuit 10.

In FIG. 16, the nozzle 25 communicates with a paste supplying unit 42 that contains an electrically conductive paste S to supply it to the hole 30 of the nozzle 25.

The electrically conductive paste S is a resin material including a metal in powder or in whisker distributed therein and a solution for dissolving the resin material into a paste state.

Figure 16A:
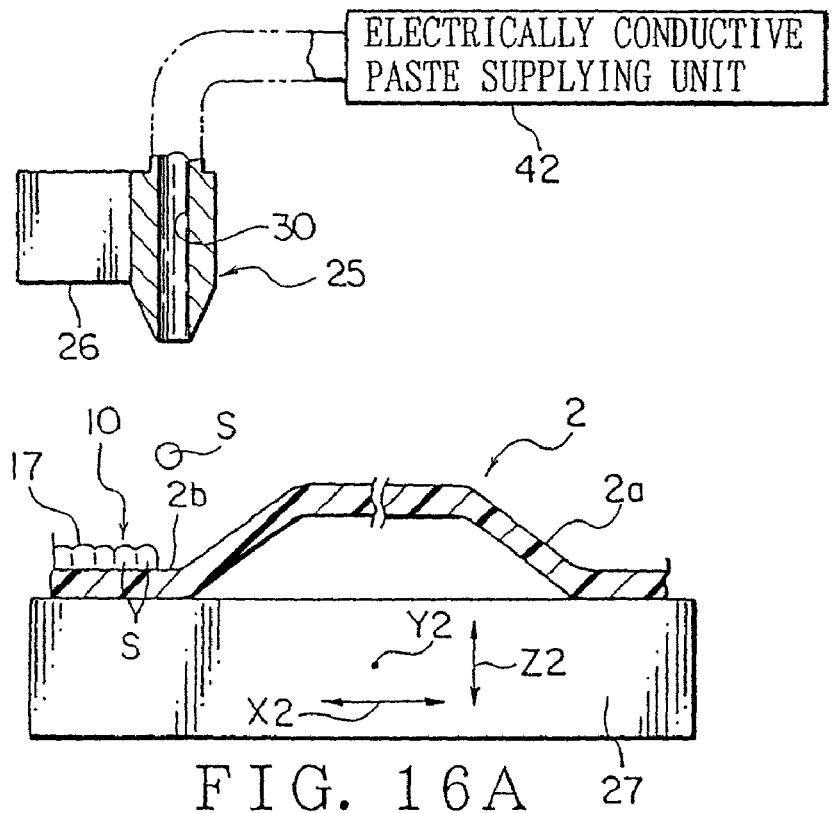
FIGS. 16A and 16B each are a perspective view showing primary parts of further another modified example of the electric circuit forming apparatus of FIG. 3.
Figure 16B:
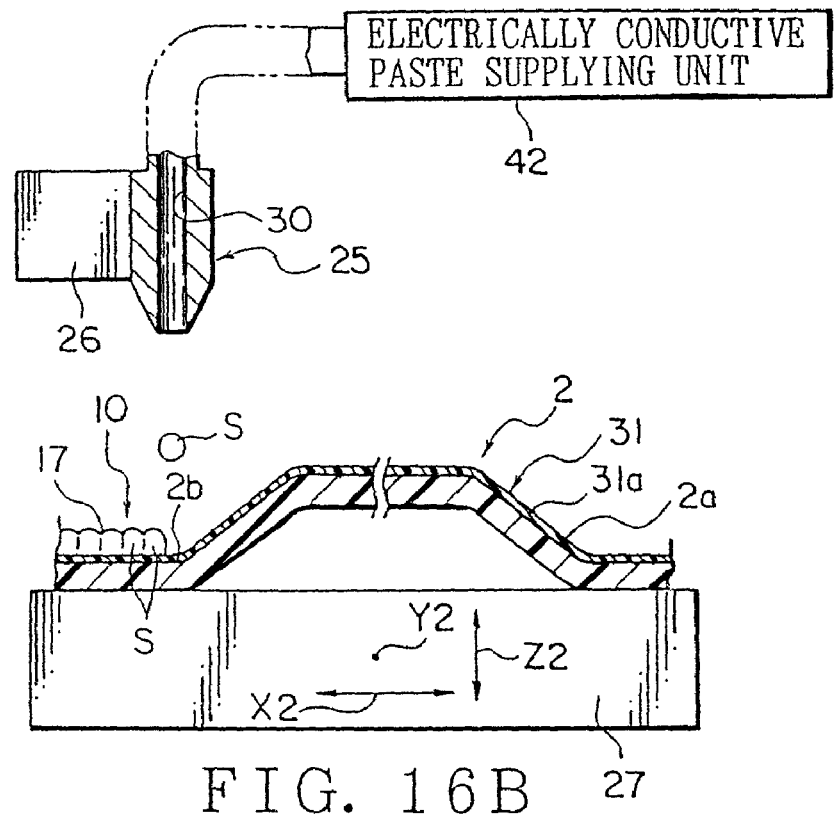

In an example illustrated in FIG. 16A or FIG. 16B, the electrically conductive paste S supplied from the paste supplying unit 42 is intermittently jetted from the hole 30 of the nozzle 25 against the door trim panel 2 or the insulating sheet 31. Grains of the electrically conductive paste are deposited on the surface 2a of the door trim panel 2 or on the insulating sheet 31, Then, the deposited electrically conductive paste is kept at a normal temperature or heated intentionally, so that the electrically conductive paste S is hardened with vaporization of the solution to define the electric lead 17 of the electric circuit 10.

The electric circuit forming apparatus 20 illustrated in FIG. 12 jets intermittently a fixed amount of the molten insulator G on the door trim panel 2 or the insulating sheet 31 to cover the electric circuit 10 by the insulator 37. Alternatively, as illustrated by dotted lines of FIG. 17, an insulating paste O and a compressed air may be jetted against on the electric circuit 10 defined on the door trim panel 2 or the insulating sheet 31 to provide the insulator 37 covering the electric lead 17 of the electric circuit 10.

In FIG. 17, the insulator nuzzle 35 communicates with an insulating paste supplying unit 43 that contains an insulating paste O to supply it to the insulator nuzzle 35.

The insulating paste O is an insulating resin material including a solution for dissolving the resin material into a paste state.

Figure 17A:
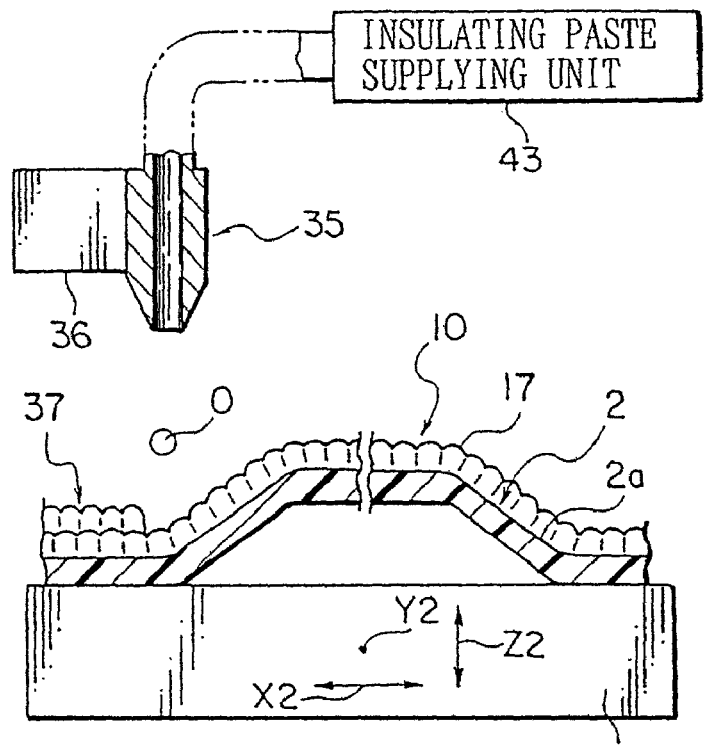
FIGS. 17A and 17B each are a perspective view showing primary parts of a modified example of the electric circuit forming apparatus of FIG. 12.
Figure 17B:
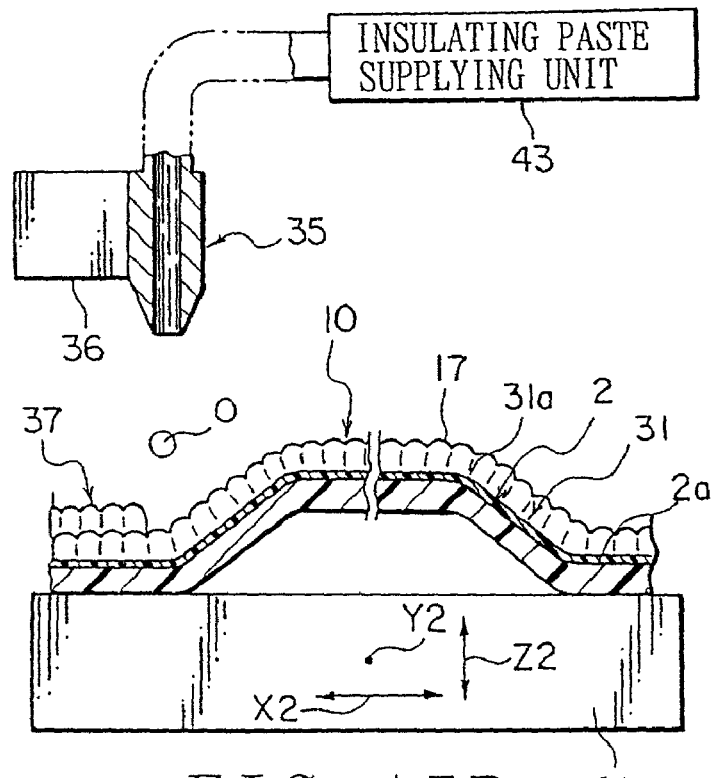
Figure 19:
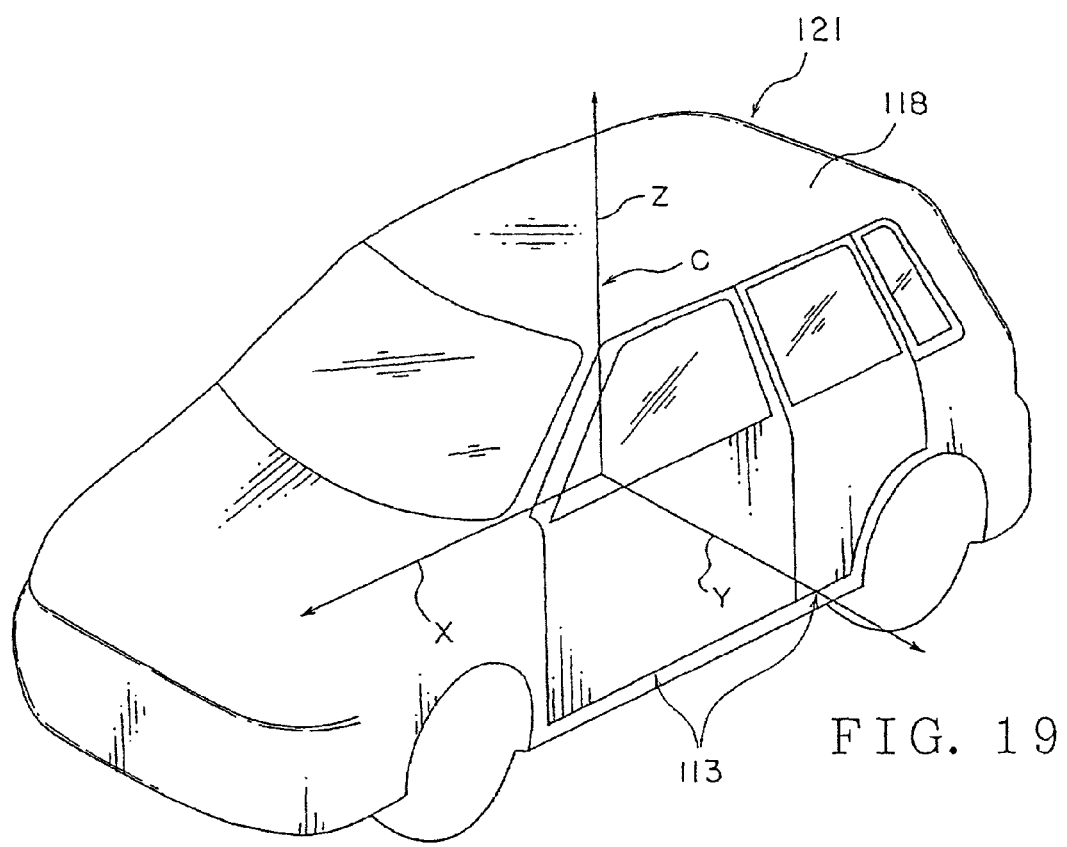
FIG. 19 is a perspective view showing a conventional coordinate system related to a car having a door.
Figure 20:
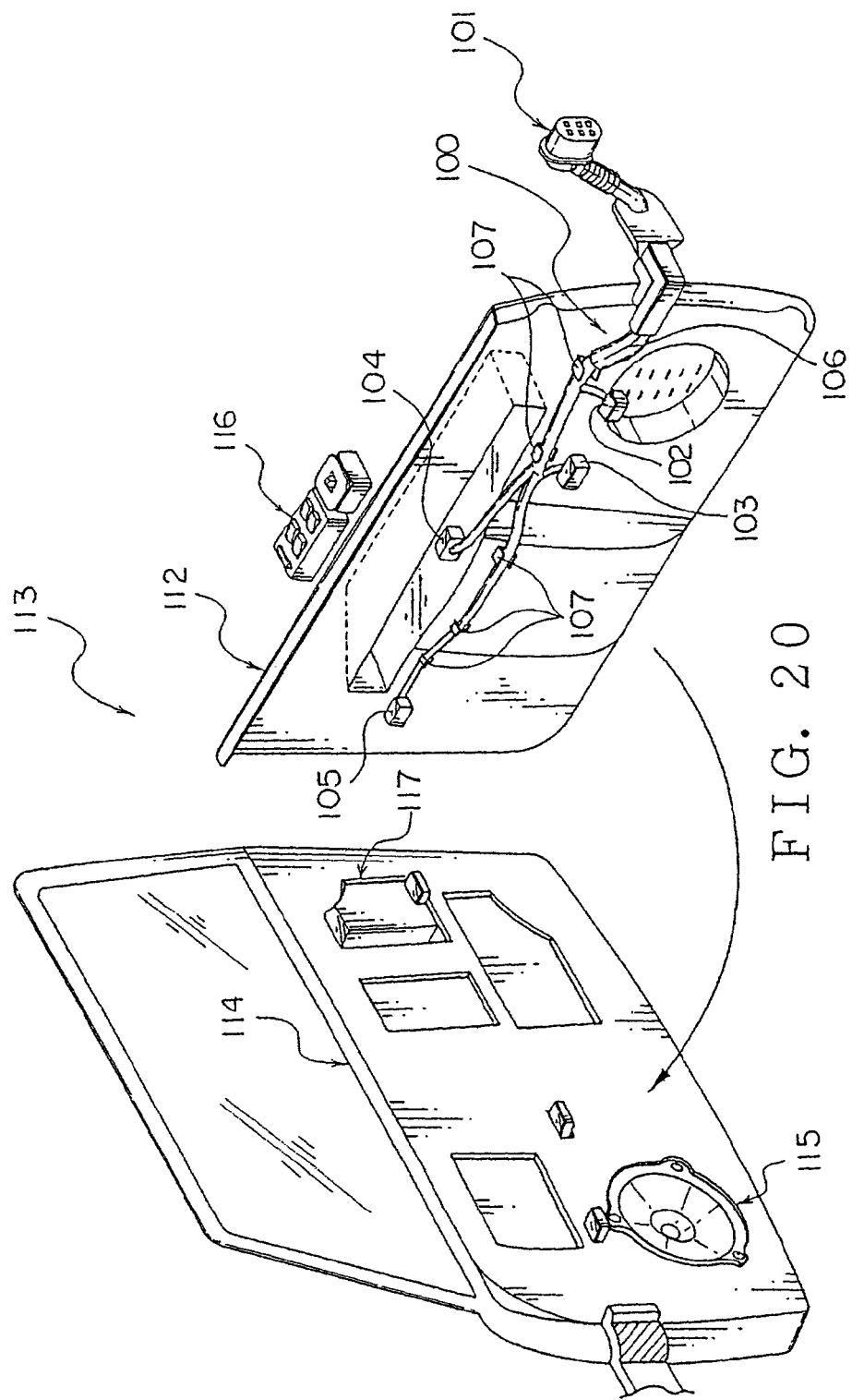
FIG. 20 is an exploded perspective view showing a conventional car door.
Figure 21:
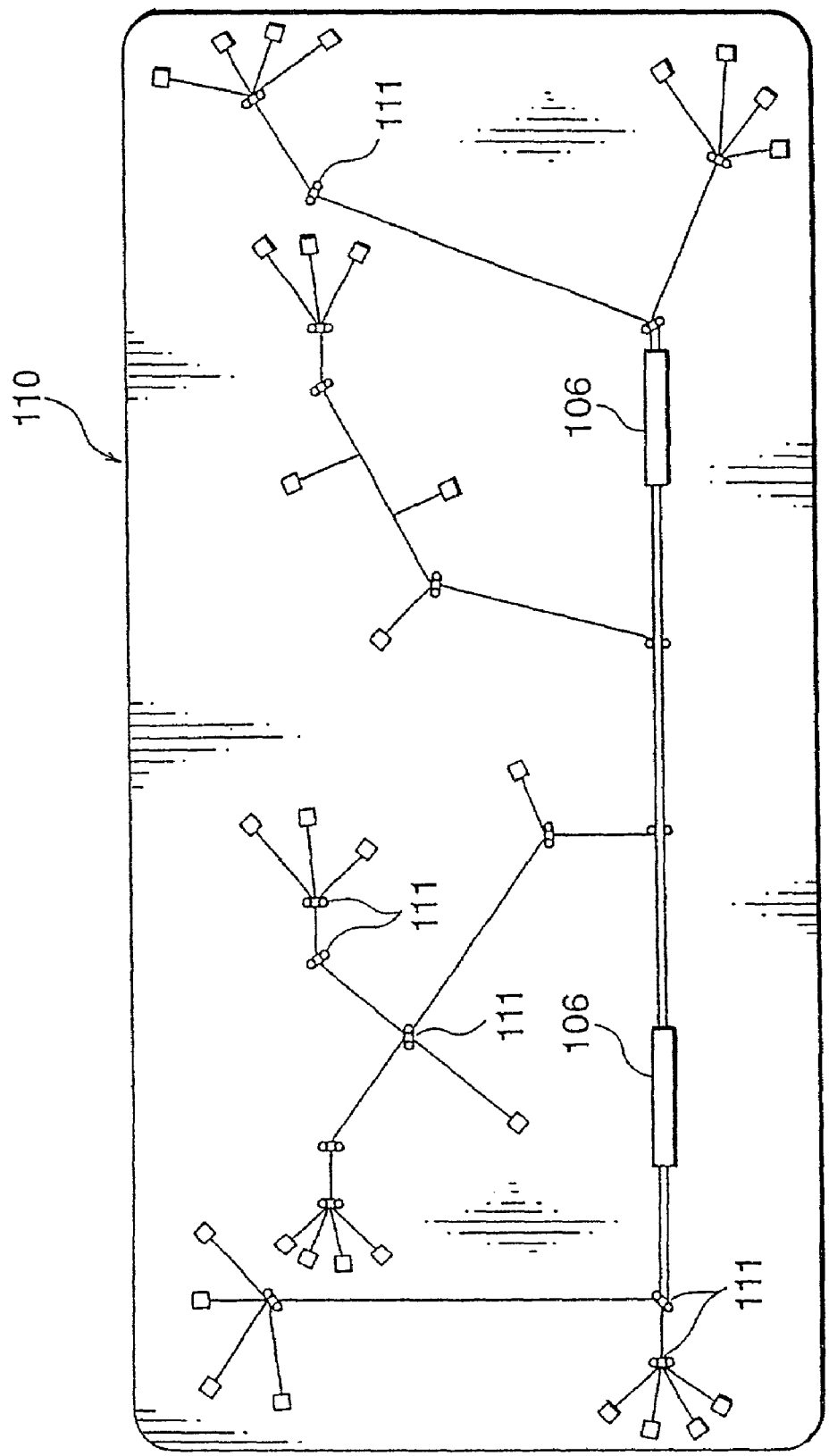
FIG. 21 is a plan view showing a wiring board used for conventionally forming a wiring harness arranged on the door of FIG. 20.

In an example illustrated in FIG. 17A or 17B, the insulating paste O supplied from the insulating paste supplying unit 43 is intermittently jetted from the insulator nuzzle 35 against the electric circuit 10 defined on the door trim panel 2 or the insulating sheet 31. Grains of the insulating paste are deposited on the electric circuit 10. Then, the deposited insulating paste is kept at a normal temperature or heated intentionally, so that the insulating paste O is hardened with vaporization of the solution to define the insulator 37 covering the electric lead 17 of the electric circuit 10.

Furthermore, a molten metal K, a molten electrically conductive plastic P, or an electrically conductive paste S may be intermittently jetted from the hole 30 of the nozzle 25 against the insulator 37 covering the electric circuit 10 to define another electric lead 17 on the insulator 37.

In the aforementioned embodiments, the electric circuit 10 is defined on the door trim panel 2, the door panel 4, or the insulating sheet 31 which is an intermediate member. In the present invention, a molten metal K, a molten electrically conductive plastic P, or an electrically conductive paste S maybe jetted on another car construction member like a roof panel, a roof trim panel, and an instrument panel or an intermediate member covering one of the construction member to define an electric circuit 10.

The present invention is not limited in a car but can be applied to a portable computer, a refrigerator, and various industrial machines. In such electric circuits, a molten metal K, a molten electrically conductive plastic P, or an electrically conductive paste S may be jetted on a construction member of a machine or an intermediate member covering the construction member to define an electric circuit 10.

The present invention is not limited in the illustrated embodiments but modifications of the embodiments will be easily provided by a person skilled in the art within the scope of the claimed invention.

What is claimed is:

1. A method for forming an electric circuit on at least one door trim panel comprised by a car, the method comprising the steps of:

determining a position and a profile of the door trim panel disposed on the car and a position and a shape of an electric circuit formed on the door trim panel when the car is designed;

storing a set of three-dimensional data of the door trim panel and the electrical circuit determined at the design into a storage section as a first reference coordinate system; and converting the car set of three-dimensional data in the first coordinate system to a door trim panel set of three-dimensional data in a second coordinate system provided in relation to the door trim panel disposed on a transfer unit and having a second origin in the door trim panel; and intermittently jetting a molten metal against the door trim panel to define rows of metal grains so as to deposit the molten metal on a surface of the door trim panel to form the electric circuit on the door trim panel based on the door trim panel set of three-dimensional data, wherein the first coordinate system and the second coordinate system do not coincide, wherein the deposited metal grains overlap one another such that the electric circuit has the cross-sectional area stored in the second set of three-dimensional data between the two points, and wherein the molten metal is jetted from a nozzle and both the nozzle and the door trim panel have respective X, Y, Z axes perpendicular to each other, the nozzle being movable along each of the X, Y, Z axes, the nozzle moving in a circumferential direction around each of the X axis and Y axis, and the door trim panel being movable along each of X, Y, Z axes and also in a circumferential direction around each of the X, Y, Z axes.

2. The method as described in claim 1 wherein an insulator is layered on the electric circuit.

3. The method as described in claim 2 wherein the method comprises the step of jetting a second molten metal against the insulator to deposit the second molten metal on the insulator.

4. A method for forming an electric circuit on an insulating intermediate member laid on at least one door trim panel comprised by a car, the method comprising the steps of:

determining a position and a profile of the door trim panel disposed on the car and a position and a shape of an electric circuit formed on the door trim panel when the car is designed;

storing a machine set of three-dimensional data of the door trim panel and the electric circuit determined at the design into a storage section as a first reference coordinate system;

converting the car set of three-dimensional data in the first coordinate system to a door trim panel set of three-dimensional data in a second coordinate system provided in relation to the door trim panel disposed on a transfer unit and having a second origin in the door trim panel; and intermittently jetting a molten metal against the door trim panel to define rows of metal grains so as to deposit the molten metal on a surface of the intermediate member to form the electric circuit on the surface of the intermediate member based on the second set of three-dimensional data, wherein the first coordinate system and the second coordinate system do not coincide, wherein the deposited metal grains overlap one another such that the electric circuit has the cross-sectional area stored in the second set of three-dimensional data between the two points, and wherein the molten metal is jetted from a nozzle and both the nozzle and the door trim panel have respective X, Y, Z axes perpendicular to each other, the nozzle being movable along each of the X, Y, Z axes, the nozzle moving in a circumferential direction around each of the X axis and Y axis, and the door trim panel being movable along each of X, Y, Z axes and also in a circumferential direction around each of the X, Y, Z axes.

5. The method as described in claim 4 wherein an insulator is layered on the electric circuit defined on the insulating intermediate member.

6. The method as described in claim 5 wherein the method comprises the step of jetting a second molten metal against the insulator to deposit the second molten metal on the insulator.

7. The method as described in claim 1, wherein, in the step of intermittently jetting the molten metal against the door trim panel, an aerosol of the molten metal is jetted with compressed air against the door trim panel to define the electric circuit.

8. The method as described in claim 7, wherein, in the step of intermittently jetting the molten metal against the door trim panel, a mask is provided for the door trim panel to prevent scattering of the molten metal, the mask having a through hole which passes the molten metal to deposit it on the door trim panel.

9. The method as described in claim 1, wherein, in the step of intermittently jetting the molten metal against the door trim panel, a compressed gas having a temperature lower than a melting or softening temperature of the metal is jetted from a nozzle with an ultrasonic speed such that the grains of the metal are entrained in the ultrasonic speed flow of the gas in the nozzle.

10. The method as described in claim 4, wherein, in the step of intermittently jetting the molten metal against the intermediate member, an aerosol of the molten metal is jetted with compressed air against the intermediate member to define the electric circuit.

11. The method as described in claim 10, wherein, in the step of intermittently jetting the molten metal against the intermediate member, a mask is provided for the intermediate member to prevent scattering of the molten metal, the mask having a through hole which passes the molten metal to deposit it on the intermediate member.

12. The method as described in claim 4, wherein, in the step of intermittently jetting the molten metal against the intermediate member, a compressed gas having a temperature lower than a melting or softening temperature of the metal is jetted from a nozzle with an ultrasonic speed such that the grains of the metal are entrained in the ultrasonic speed flow of the gas in the nozzle.

13. The method as recited in claim 1, wherein corresponding axes of the first coordinate system and the second coordinate system are non-parallel and wherein the first origin and the second origin do not coincide.

14. The method as recited in claim 4, wherein corresponding axes of the first coordinate system and the second coordinate system are non-parallel and wherein the first origin and the second origin do not coincide.

* * * * *